(12) United States Patent
Lee

(10) Patent No.: US 11,765,896 B2
(45) Date of Patent: Sep. 19, 2023

(54) SEMICONDUCTOR DEVICE WITH STEPPED SOURCE STRUCTURE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 79 days.

(21) Appl. No.: 16/933,440

(22) Filed: Jul. 20, 2020

(65) Prior Publication Data

US 2021/0242234 A1  Aug. 5, 2021

(30) Foreign Application Priority Data

Jan. 30, 2020  (KR) ........................ 10-2020-0011397

(51) Int. Cl.
*H10B 43/27* (2023.01)
*H10B 43/10* (2023.01)
*H10B 43/35* (2023.01)

(52) U.S. Cl.
CPC ............. *H10B 43/27* (2023.02); *H10B 43/10* (2023.02); *H10B 43/35* (2023.02)

(58) Field of Classification Search
CPC ... H01L 27/115–11597; H01L 21/8247; H10B 43/27; H10B 43/10; H10B 43/35; H10B 43/30; H10B 43/00; H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/20; H10B 43/23; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 2016/0190155 A1* | 6/2016 | Lee | H01L 27/1157 438/667 |
| 2016/0260733 A1* | 9/2016 | Lue | H01L 27/11565 |
| 2017/0162594 A1* | 6/2017 | Ahn | H01L 27/11582 |
| 2018/0366486 A1* | 12/2018 | Hada | H01L 27/11565 |
| 2019/0115359 A1* | 4/2019 | Moon | H01L 21/0274 |
| 2019/0333922 A1* | 10/2019 | Jung | H01L 27/11565 |
| 2020/0303400 A1* | 9/2020 | Arai | H01L 27/11582 |
| 2021/0020655 A1* | 1/2021 | Yoshimura | H01L 27/11582 |
| 2021/0335810 A1* | 10/2021 | Sanghoon | H01L 27/11565 |

FOREIGN PATENT DOCUMENTS

| | | |
|---|---|---|
| KR | 101792778 B1 | 11/2017 |
| KR | 1020180137264 A | 12/2018 |

* cited by examiner

*Primary Examiner* — Didarul A Mazumder
*Assistant Examiner* — Gustavo G Ramallo
(74) *Attorney, Agent, or Firm* — WILLIAM PARK & ASSOCIATES LTD.

(57) ABSTRACT

There are provided a semiconductor device and a manufacturing method thereof. The semiconductor device includes: a stack structure; a source structure; a channel structure penetrating the stack structure, the channel structure being connected to the source structure; and a first memory layer interposed between the channel structure and the stack structure. The source structure includes a first protrusion part protruding between the first memory layer and the channel structure.

20 Claims, 22 Drawing Sheets

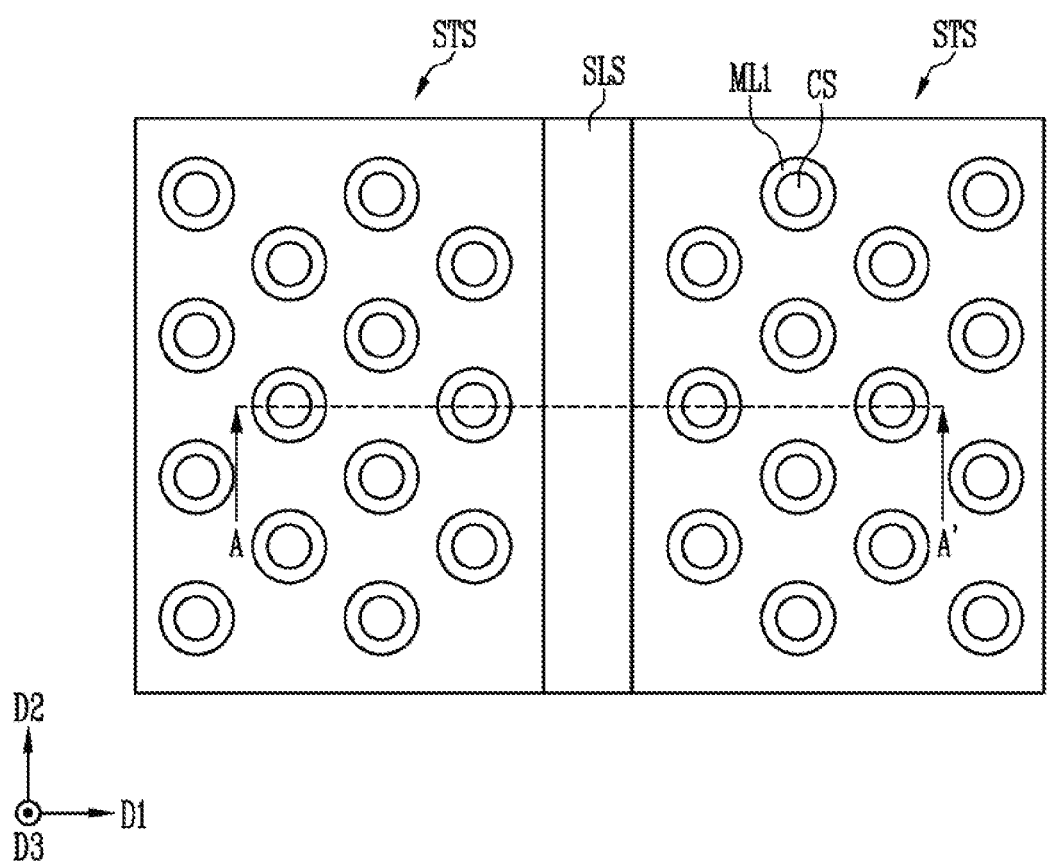

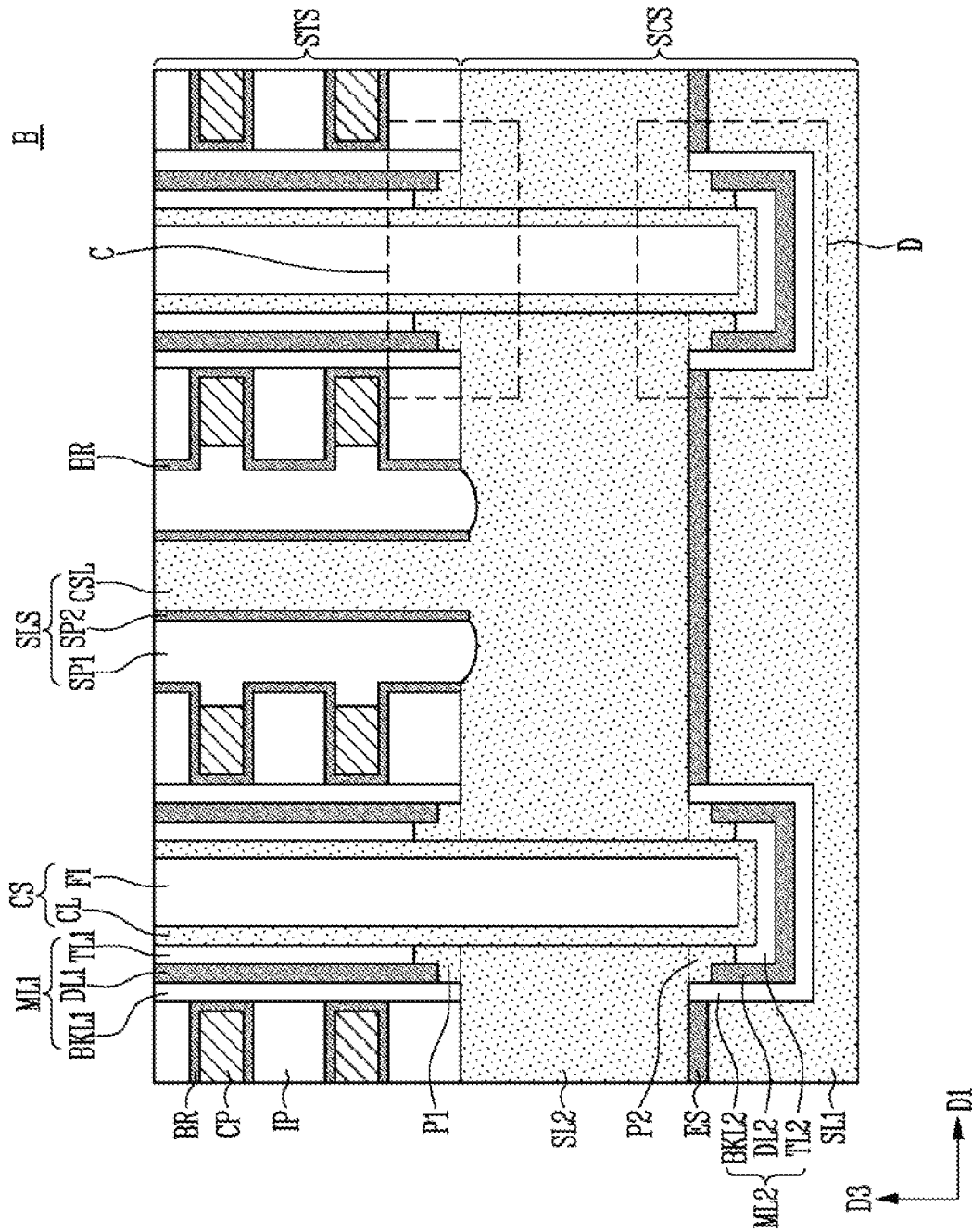

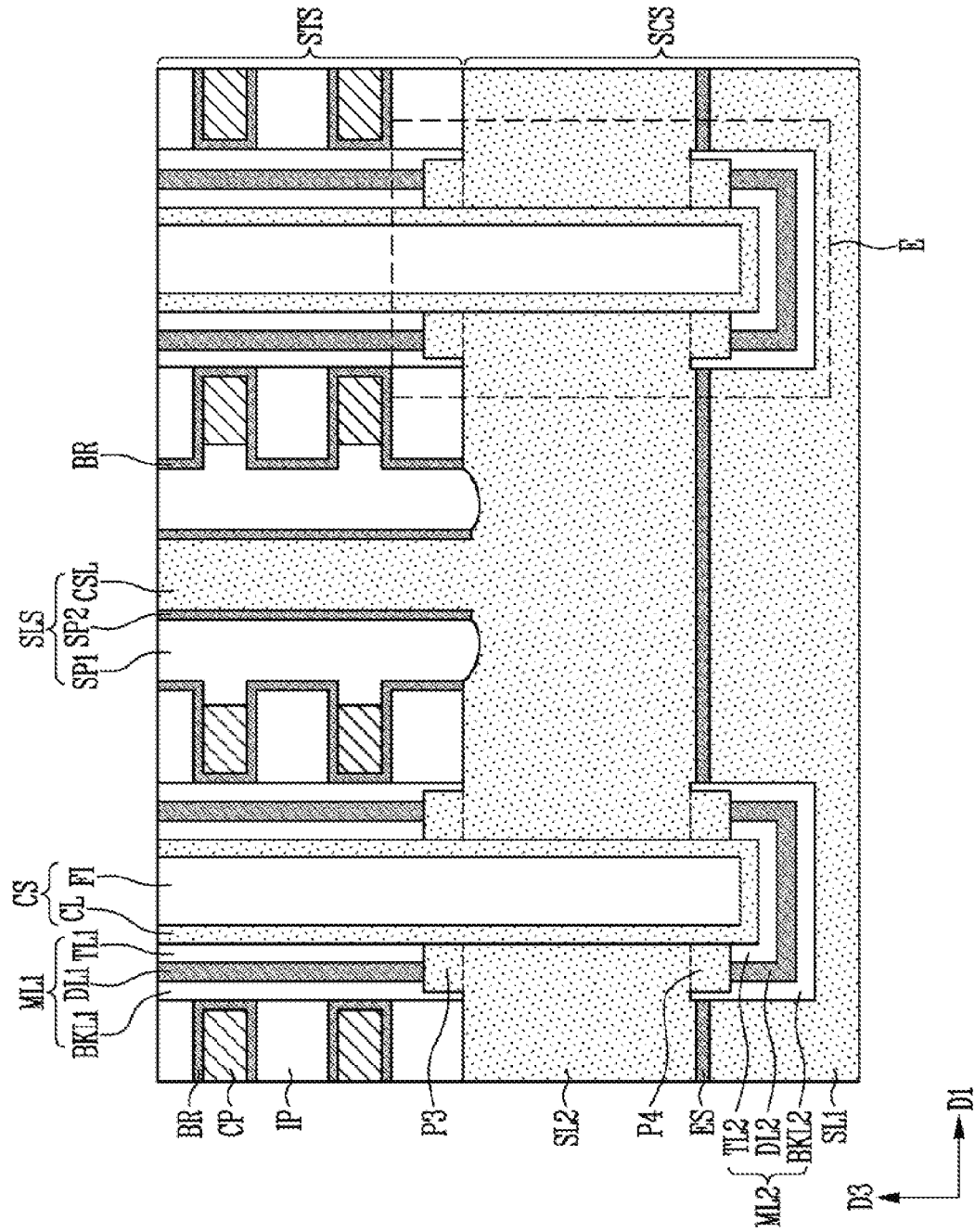

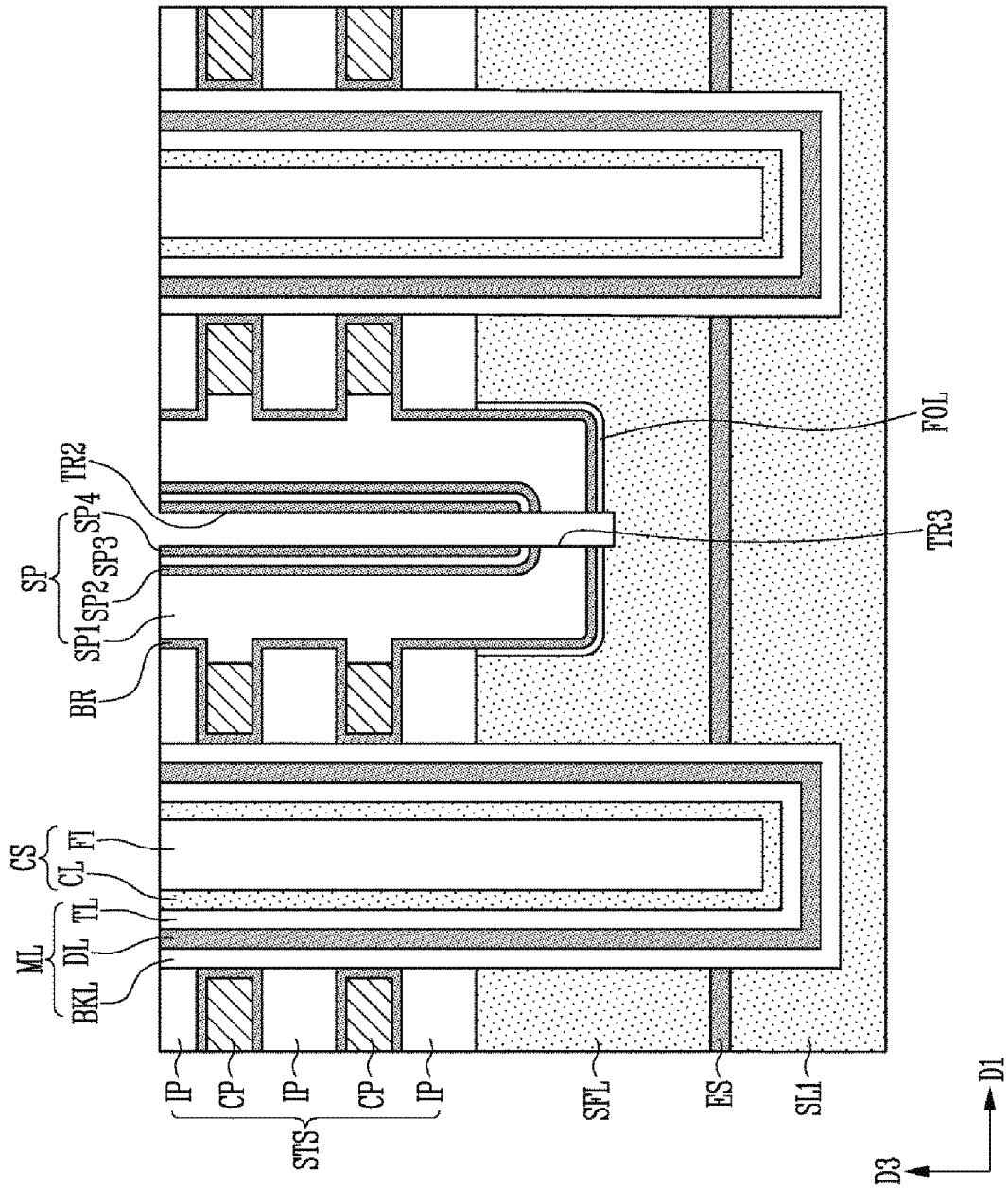

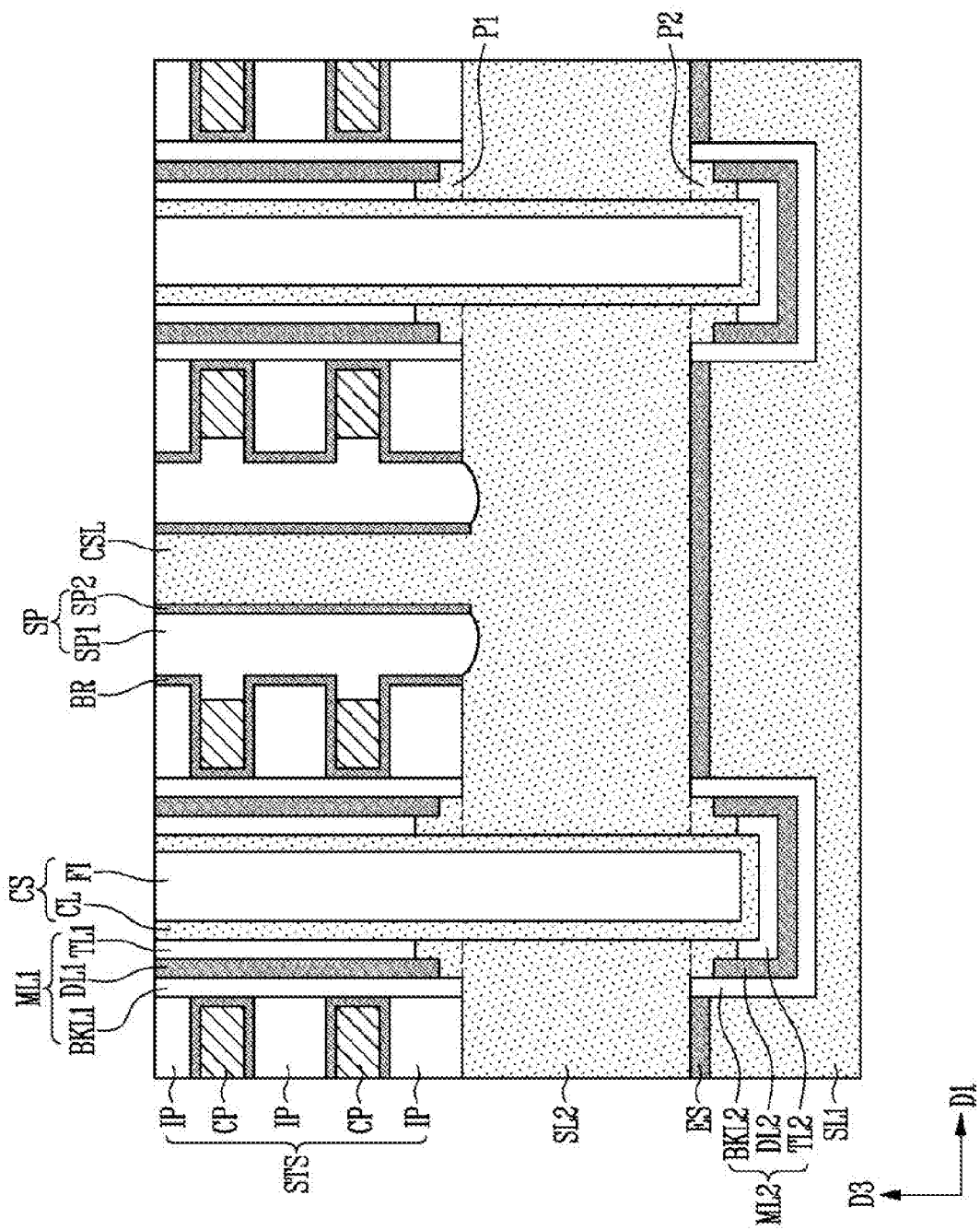

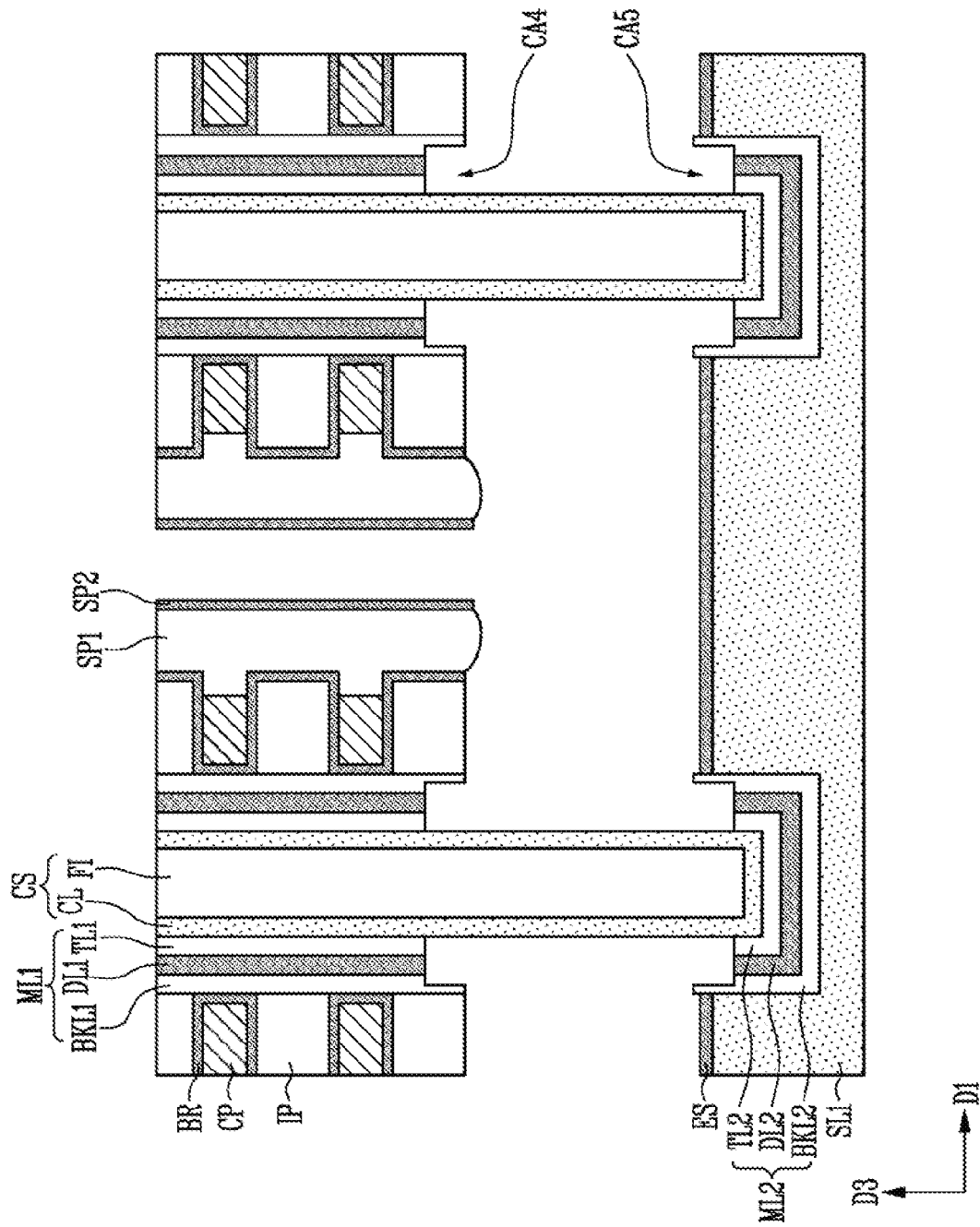

SEMICONDUCTOR DEVICE WITH STEPPED SOURCE STRUCTURE

CROSS-REFERENCE TO RELATED APPLICATION

The present application claims priority under 35 U.S.C. § 119(a) to Korean patent application number 10-2020-0011397, filed on Jan. 30, 2020, in the Korean Intellectual Property Office, the entire disclosure of which is incorporated herein by reference.

BACKGROUND

1. Technical Field

The present disclosure generally relates to a semiconductor device and a manufacturing method thereof, and more particularly, to a three-dimensional semiconductor device and a manufacturing method of the semiconductor device.

2. Related Art

A semiconductor device includes an integrated circuit configured with a Metal Oxide Semiconductor Field Effect Transistor (MOSFET). As the size and design rule of the semiconductor device are gradually reduced, scaling down of MOSFETs is gradually accelerated.

The scaling down of the MOSFETs may cause a short channel effect, etc., and therefore, operational characteristics of the semiconductor device may be deteriorated. Accordingly, there have been researched various method for forming a semiconductor device having greater performance while overcoming a limitation due to high integration of the semiconductor device.

Further, such an integration circuit pursues operational reliability and low power consumption. Thus, there has been researched a method for forming a device which has higher reliability and lower power consumption in a smaller space.

SUMMARY

In accordance with an aspect of the present disclosure, there is provided a semiconductor device that may include: a stack structure; a source structure including a first protrusion part protruding toward the stack structure; a channel structure penetrating the stack structure, the channel structure being connected to the source structure; a first tunnel insulating layer interposed between the channel structure and the stack structure; a first data storage layer interposed between the first tunnel insulating layer and the stack structure; and a first blocking layer interposed between the first data storage layer and the stack structure, wherein the first protrusion part is in contact with a bottom surface of the first tunnel insulating layer, a bottom surface of the first data storage layer, and a sidewall of the first blocking layer.

In accordance with another aspect of the present disclosure, there is provided a semiconductor device that may include: a source structure; a stack structure; a channel structure penetrating the stack structure, the channel structure being connected to the source structure; and a first memory layer interposed between the channel structure and the stack structure, wherein the source structure includes a first protrusion part protruding between the first memory layer and the channel structure, wherein the first protrusion part has a stepped structure.

In accordance with still another aspect of the present disclosure, there is provided a method of manufacturing a semiconductor device, the method may include: forming a source sacrificial layer; forming a stack structure over the source sacrificial layer; forming a memory layer, wherein the memory layer penetrates the stack structure and includes a tunnel insulating layer and a data storage layer surrounding the tunnel insulating layer; removing the source sacrificial layer to expose the memory layer; and removing a first exposure region of the data storage layer, wherein a portion of a second exposure region of the tunnel insulating layer is removed, when the first exposure region of the data storage layer is removed.

In accordance with still another aspect of the present disclosure, there is provided a method of manufacturing a semiconductor device, the method may include: forming a source structure including a source sacrificial layer; forming a stack structure over the source structure; forming a channel structure penetrating the stack structure, a tunnel insulating layer surrounding the channel structure, a data storage layer surrounding the tunnel insulating layer, and a blocking layer surrounding the data storage layer; removing the source sacrificial layer to expose the blocking layer; etching the blocking layer to expose the data storage layer; etching the data storage layer to expose the tunnel insulating layer; and selectively etching the tunnel insulating layer, where a concentration of nitrogen of the tunnel insulating layer is higher than that of nitrogen of the blocking layer.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

Embodiments provide a semiconductor device capable of improving operational reliability and a manufacturing method of the semiconductor device.

Figure 1B:
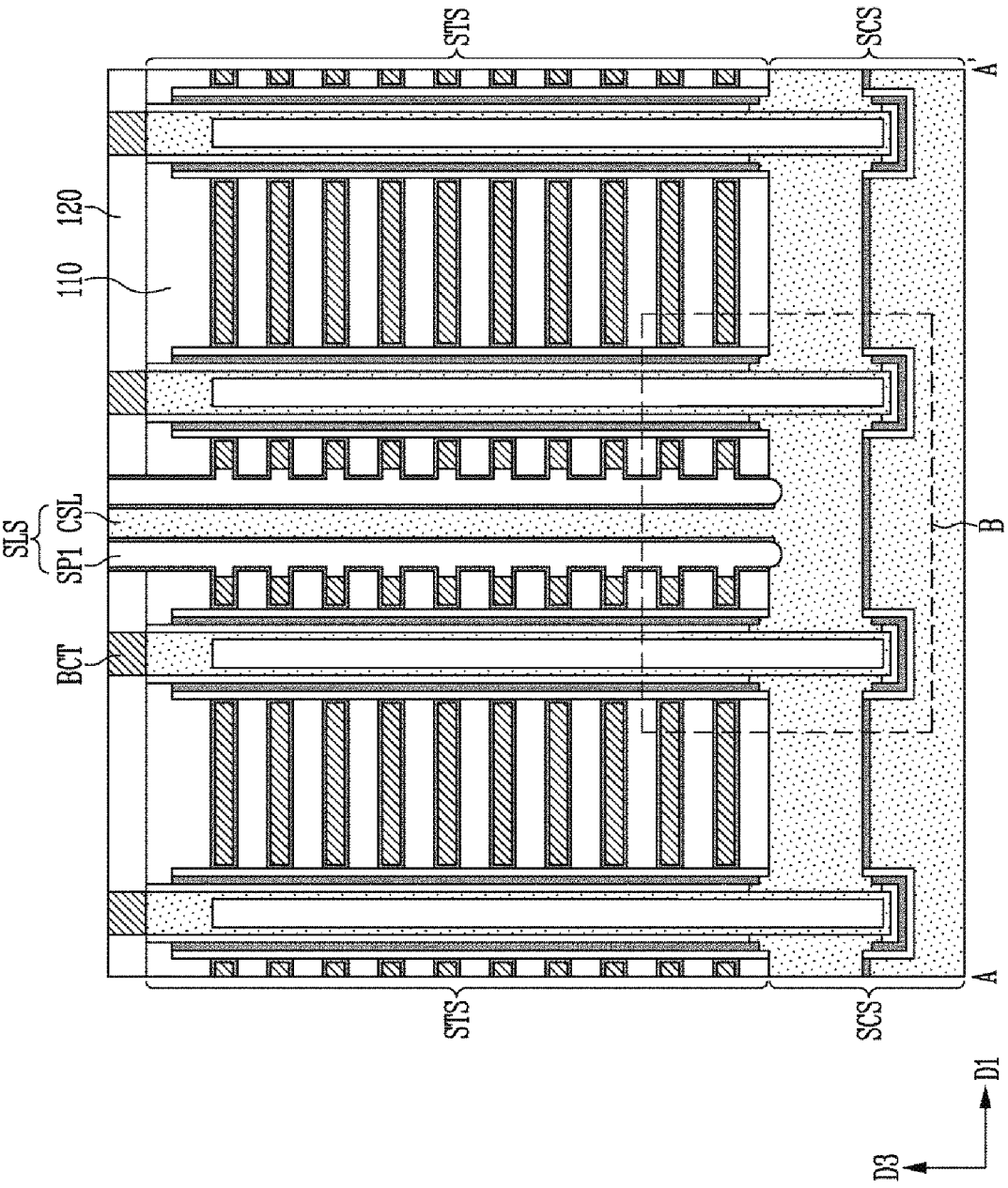

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1A is a plan view of a semiconductor device in accordance with an embodiment of the present disclosure.

FIG. 1B is a sectional view taken along line A-A' shown in FIG. 1A.

FIG. 1C is an enlarged view of region B shown in FIG. 1B.

Figure 1D:
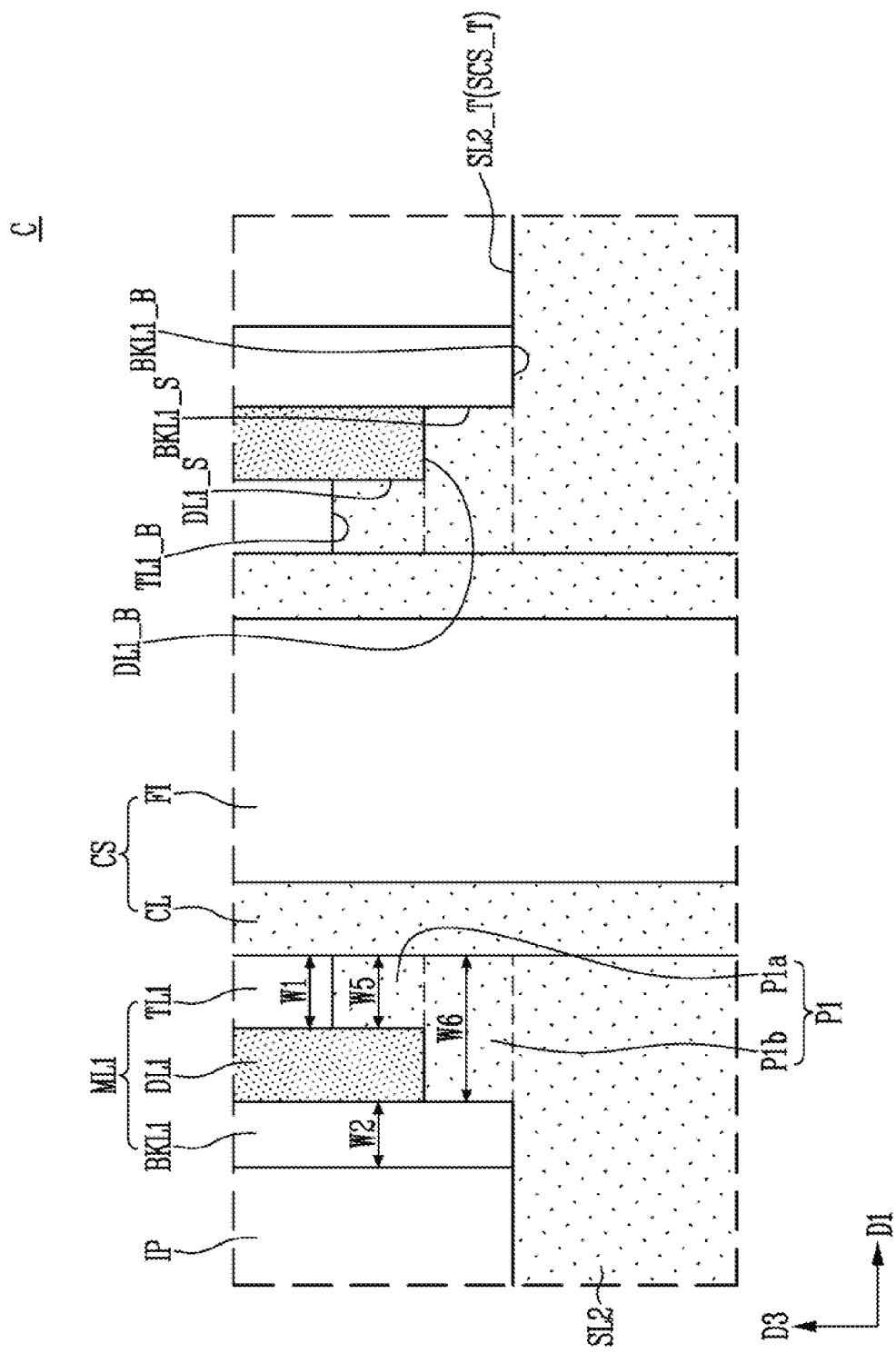

FIG. 1D is an enlarged view of region C shown in FIG. 1C.

Figure 1E:
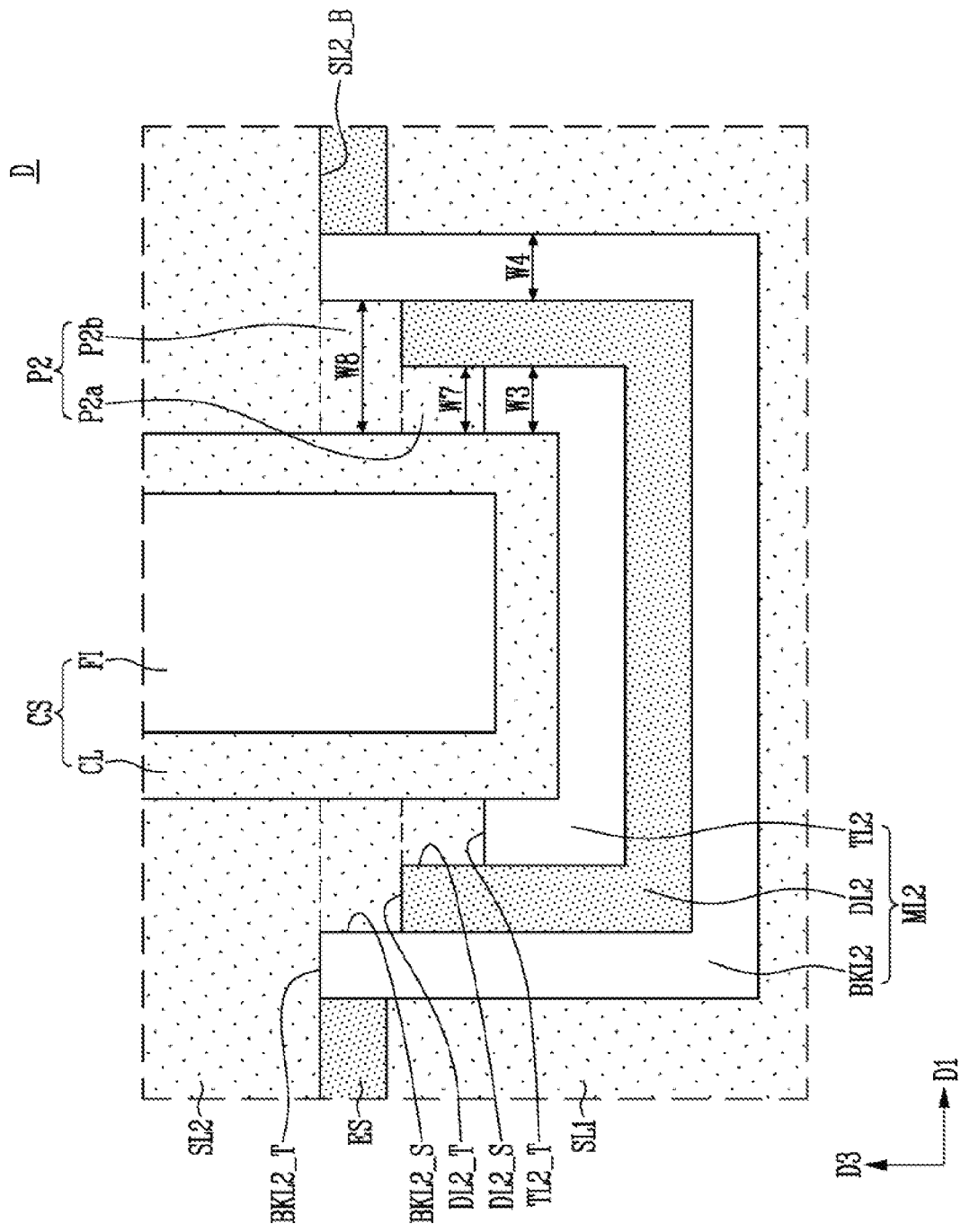

FIG. 1E is an enlarged view of region D shown in FIG. 1C.

FIG. 2A is a sectional view of a semiconductor device in accordance with an embodiment of the present disclosure.

Figure 2B:
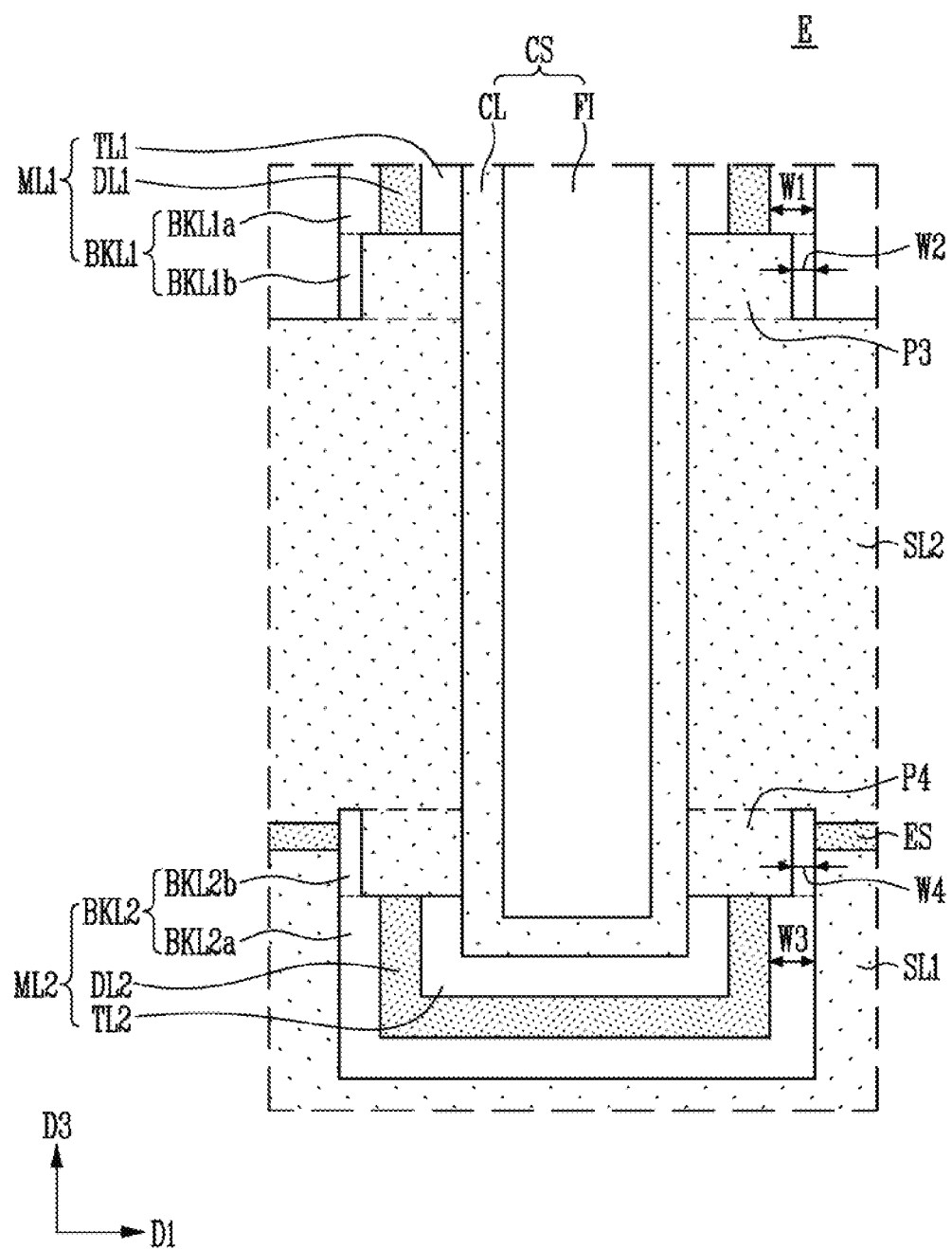

FIG. 2B is an enlarged view of region E shown in FIG. 2A.

FIGS. 3A, 3B, 3C, 3D, 3E, 3F, 3G, 3H, 3I, 3J, and 3K are sectional views illustrating a manufacturing method of the semiconductor device shown in FIGS. 1A, 1B, 1C, 1D, and 1E.

Figure 4A:
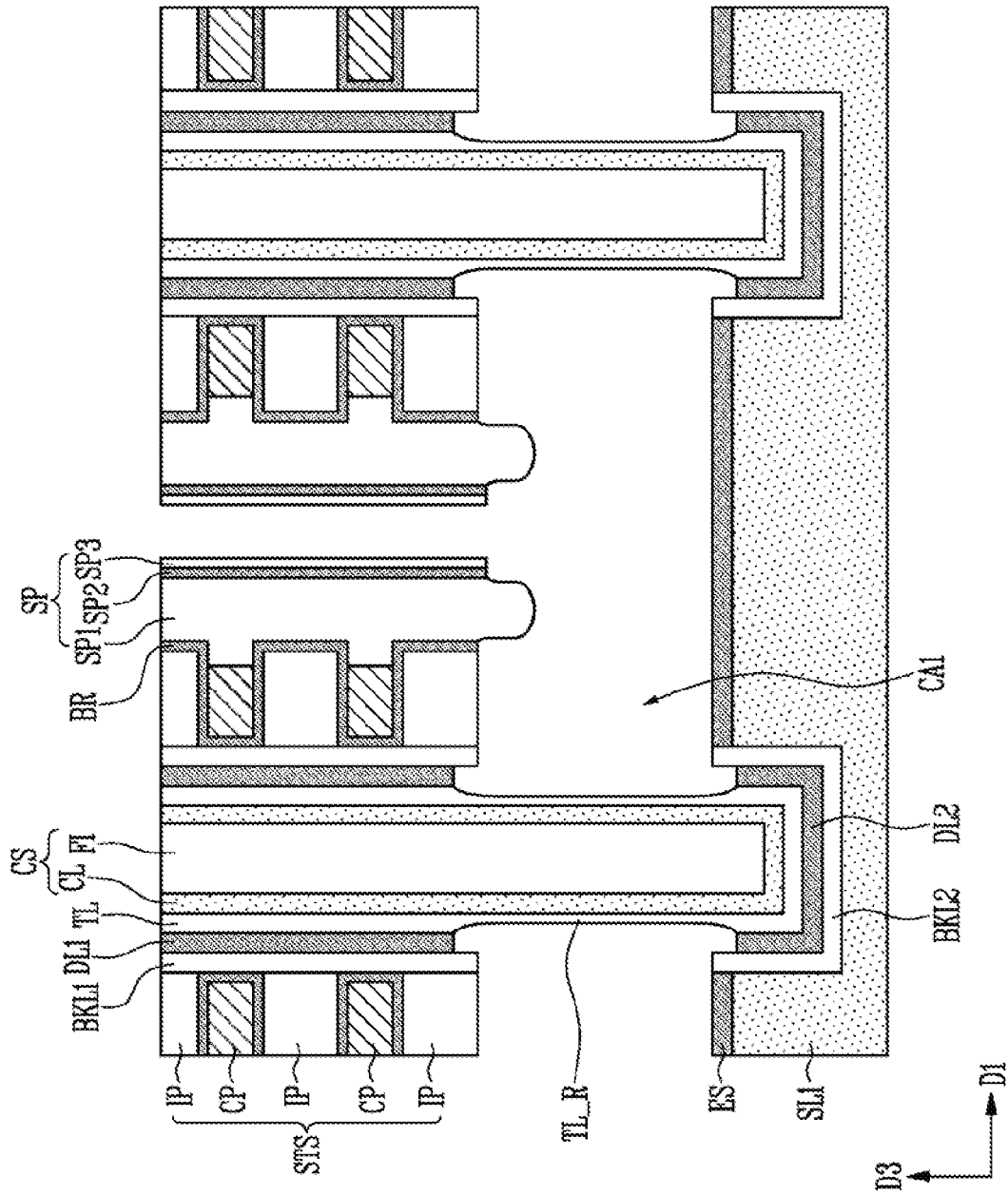
Figure 4C:
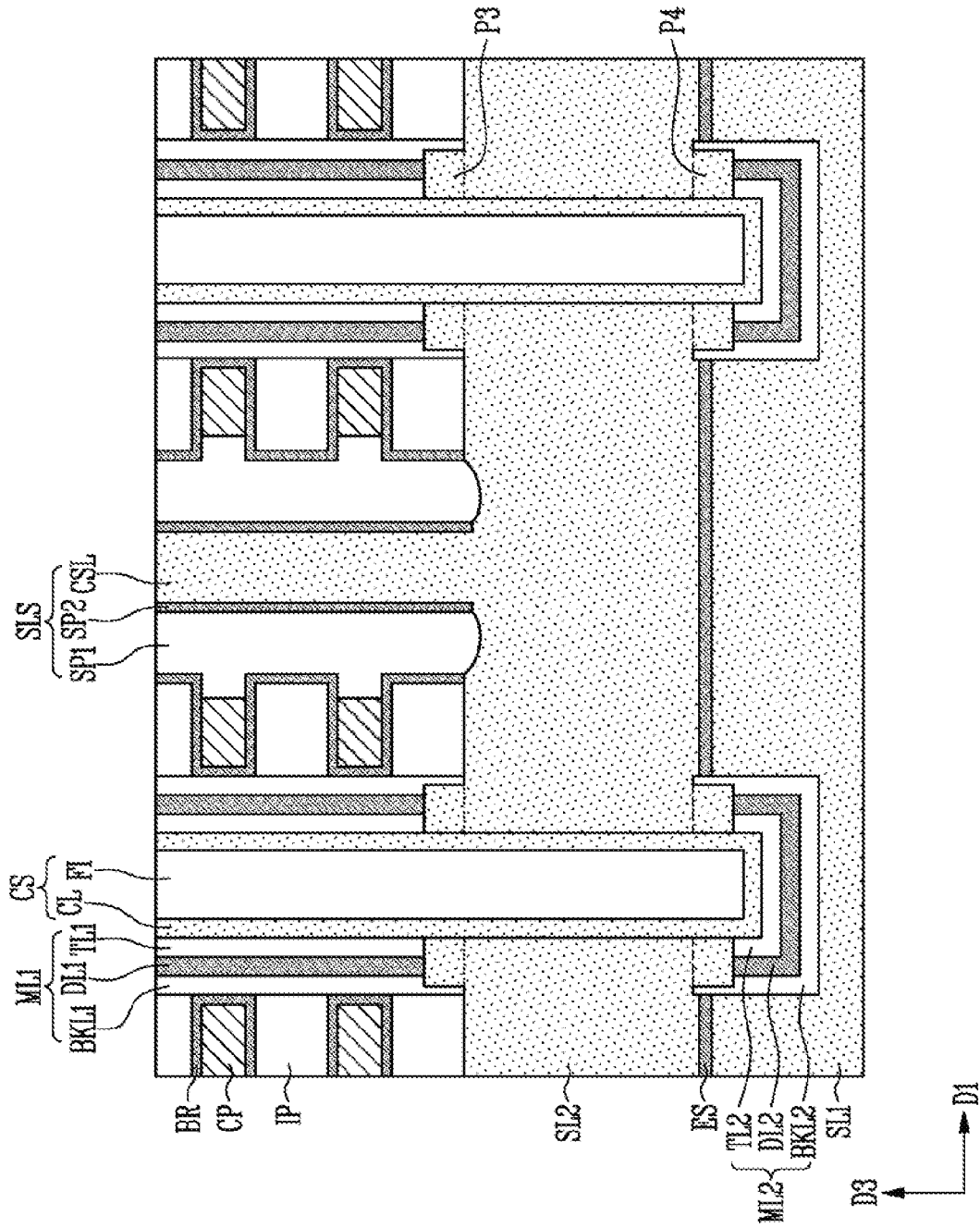

FIGS. 4A, 4B, and 4C are sectional views illustrating a manufacturing method of the semiconductor device shown in FIGS. 2A and 2B.

Figure 5:
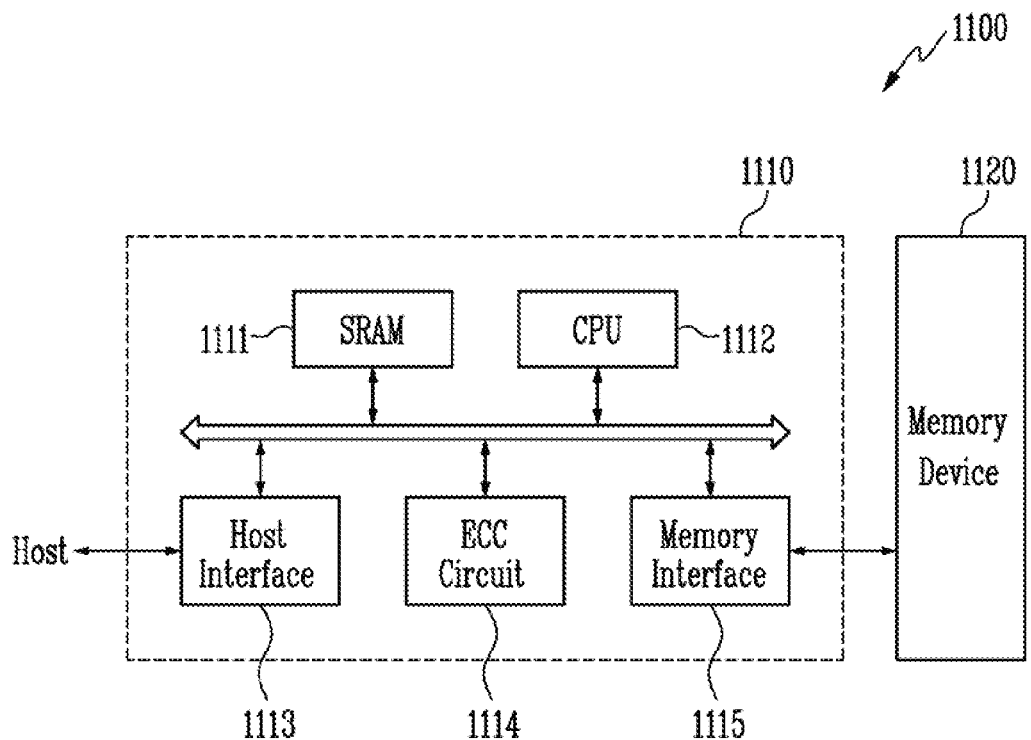

FIG. 5 is a block diagram illustrating a configuration of a memory system in accordance with an embodiment of the present disclosure.

Figure 6:
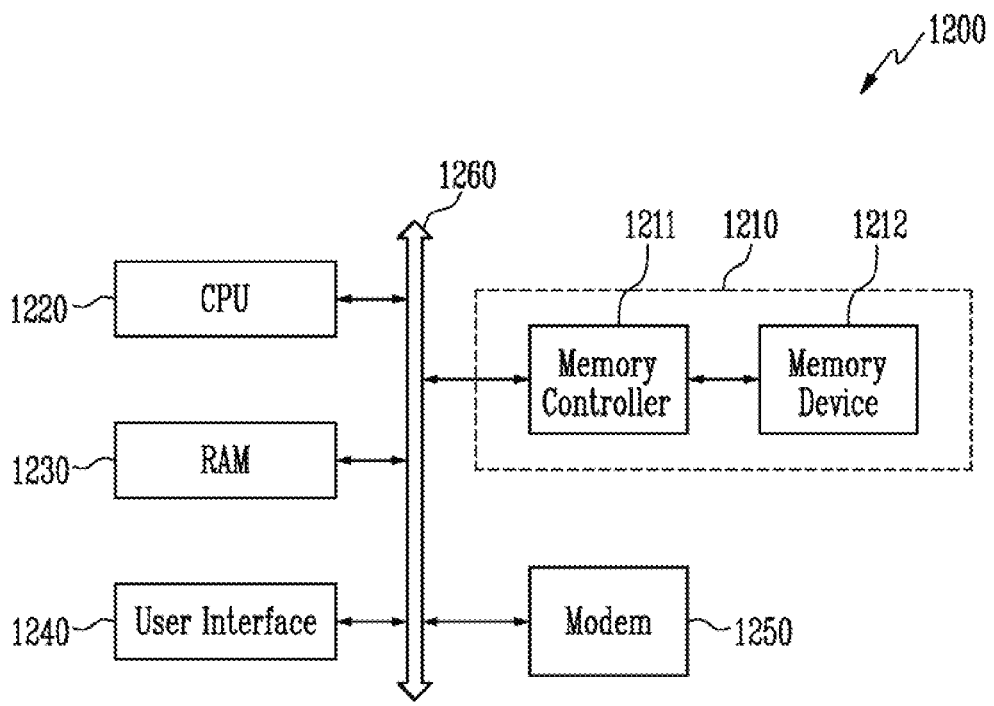

FIG. 6 is a block diagram illustrating a configuration of a computing system in accordance with an embodiment of the present disclosure.

DETAILED DESCRIPTION

The specific structural or functional description disclosed herein is merely illustrative for the purpose of describing embodiments according to the concepts of the present disclosure. The embodiments according to the concepts of the present disclosure can be implemented in various forms, and cannot be construed as limited to the embodiments set forth herein.

FIG. 1A is a plan view of a semiconductor device in accordance with an embodiment of the present disclosure. FIG. 1B is a sectional view taken along line A-A' shown in FIG. 1A. FIG. 1C is an enlarged view of region B shown in FIG. 1B. FIG. 1D is an enlarged view of region C shown in FIG. 1C. FIG. 1E is an enlarged view of region D shown in FIG. 1C.

Referring to FIGS. 1A to 1E, the semiconductor device in accordance with these embodiments may include a source structure SCS. The source structure SCS may have the shape of a plate expanding along a plane defined by a first direction D1 and a second direction D2. The first direction D1 and the second direction D2 may intersect each other. In an example, the first direction D1 and the second direction D2 may be perpendicular to each other.

In an example, the source structure SCS may be provided on a substrate. In an example, the substrate may be a semiconductor substrate. In an example, the substrate may be a bulk silicon substrate, a silicon on insulator substrate, a germanium substrate, a germanium on insulator substrate, a silicon-germanium substrate, or an epitaxial thin film formed through a selective epitaxial growth process.

In an example, the source structure SCS may be provided on an insulating layer. The insulating layer may be an insulating layer covering peripheral circuit elements and peripheral circuit lines. The peripheral circuit elements and the peripheral circuit lines may be provided in the insulating layer. In an example, the peripheral circuit elements may include elements constituting a row decoder, a column decoder, a page buffer circuit, and an input/output circuit. The peripheral circuit lines may be electrically connected to the peripheral circuit elements. In an example, the insulating layer may include oxide.

The source structure SCS may include a first source layer SL1, an etch stop layer ES on the first source layer SL1, and a second source layer SL2 on the etch stop layer ES. The first source layer SL1, the etch stop layer ES, and the second source layer SL2 may be sequentially stacked along a third direction D3. The third direction D3 may intersect the first direction D1 and the second direction D2. In an example, the third direction D3 may be perpendicular to the first direction D1 and the second direction D2. The first source layer SL1 and the second source layer SL2 may be spaced apart from each other by the etch stop layer ES. The etch stop layer ES may be provided between the first source layer SL1 and the second source layer SL2.

Each of the first source layer SL1, the etch stop layer ES, and the second source layer SL2 may have the shape of a plate expanding along a plane defined by the first direction D1 and the second direction D2. The etch stop layer ES may include an insulating material. In an example, the etch stop layer ES may include at least one of SiCO and SiCN. The first source layer SL1 may include a semiconductor material. In an example, the first source layer SL1 may include poly-silicon. The second source layer SL2 may include a semiconductor material. In an example, the second source layer SL2 may include doped poly-silicon. The etch stop layer ES may include a material different from that of the first and second source layers SL1 and SL2.

A stack structure STS may be provided on the source structure SCS. The stack structure STS may be in contact with the source structure SCS. The stack structure STS may be provided on the second source layer SL2. The stack structure STS may include conductive patterns CP and insulating patterns IP, which are alternately stacked in the third direction D3. An insulating pattern IP may be provided on the second source layer SL2, and conductive patterns and insulating patterns IP may be alternately stacked on the insulating pattern IP. A bottom surface of the insulating pattern IP of the stack structure STS may be in contact with a top surface SCS_T of the source structure SCS. The bottom surface of the insulating pattern IP of the stack structure STS may be in contact with a top surface SL2_T of the second source layer SL2 of the source structure SCS.

The insulating patterns IP may include an insulating material. In an example, the insulating patterns IP may include oxide. The conductive patterns CP may include a conductive material. In an example, the conductive patterns CP may include at least one of a doped silicon layer, a metal silicide layer, tungsten, nickel, and cobalt. The conductive patterns CP may be used as a word line connected to a memory cell or a select line connected to a select transistor.

The stack structure STS may further include blocking films BR. The blocking film BR may be formed between the conductive pattern CP and the insulating pattern IP. The blocking film BR may cover a surface of the insulating pattern IP. The conductive pattern CP and the insulating pattern IP may be spaced apart from each other by the blocking film BR. In an example, the blocking film BR may include aluminum oxide.

The stack structure STS may further include an upper insulating pattern 110. The upper insulating pattern 110 may be disposed at an uppermost portion of the stack structure STS. The upper insulating pattern 110 may include an insulating material. In an example, the upper insulating pattern 110 may include oxide.

Channel structures CS may be provided, which penetrate the stack structure STS, the second source layer SL2, and the etch stop layer ES. The channel structures CS may extend in the third direction D3. The channel structures CS may be electrically connected to the second source layer SL2.

A lowermost portion of the channel structure CS may be provided in the first source layer SL1. The lowermost portion of the channel structure CS may be surrounded by the first source layer SL1. A level of the lowermost portion of the channel structure CS may be lower than that of a top surface of the first source layer SL1, and be higher than that of a bottom surface of the first source layer SL1. The level of the lowermost portion of the channel structure CS may be lower than that of a bottom surface of the etch stop layer ES.

Each of the channel structures CS may include a filling layer FI and a channel layer CL surrounding the filling layer FI. The filling layer FI and the channel layer CL may penetrate the stack structure STS, the second source layer SL2, and the etch stop layer ES. The channel layer CL may be electrically connected to the second source layer SL2. The filling layer FI may include an insulating material. In an example, the filling layer may include oxide. The channel layer CL may include a semiconductor material. In an example, the channel layer CL may include poly-silicon.

Unlike as shown in the drawings, the channel structure CS might not include the filling layer FI, and be configured with only the channel layer CL.

There may be provided a first memory layer ML1 surrounding an upper portion and an intermediate portion of the channel structure CS and a second memory layer ML2 surrounding a lower portion of the channel structure CS. The first memory layer ML1 may surround an upper portion and an intermediate portion of the channel layer CL, and the second memory layer ML2 may surround a lower portion of the channel layer CL.

The first memory layer ML1 and the second memory layer ML2 may be spaced apart from each other in the third direction D3. The second source layer SL2 may be provided between the first memory layer ML1 and the second memory layer ML2. The first memory layer ML1 may be provided in the stack structure STS. The second memory layer ML2 may be provided in the first source layer SL1 of the source structure SCS.

The first memory layer ML1 may include a first tunnel insulating layer TL1 surrounding the upper portion and the intermediate portion of the channel layer CL, a first data storage layer DL1 surrounding the first tunnel insulating layer TL1, and a first blocking layer BKL1 surrounding the first data storage layer DL1. A width of the first tunnel insulating layer TL1 may be smaller than that of the first blocking layer BKL1. In an example, the width of the first tunnel insulating layer TL1 in the first direction D1 may be defined as a first width W1, and the width of the first blocking layer BKL1 in the first direction D1 may be defined as a second width W2. The first width W1 may be smaller than the second width W2.

The second memory layer ML2 may include a second tunnel insulating layer TL2 surrounding the lower portion of the channel layer CL, a second data storage layer DL2 surrounding the second tunnel insulating layer TL2, and a second blocking layer BKL2 surrounding the second data storage layer DL2. A width of the second tunnel insulating layer TL2 may be smaller than that of the second blocking layer BKL2. In an example, the width of the second tunnel insulating layer TL2 in the first direction D1 may be defined as a third width W3, and the width of the second blocking layer BKL2 in the first direction D1 may be defined as a fourth width W4. The third width W3 may be smaller than the fourth width W4. In an example, the third width W3 may be equal to the first width W1. In an example, the fourth width W4 may be equal to the second width W2.

The first memory layer ML1 may be interposed between the channel structure CS and the stack structure STS. The first tunnel insulating layer TL1 may be interposed between the channel structure CS and the stack structure STS, the first data storage layer DL1 may be interposed between the first tunnel insulating layer TL1 and the stack structure STS, and the first blocking layer BKL1 may be disposed between the first data storage layer DL1 and the stack structure STS.

The second memory layer ML2 may be interposed between the channel structure CS and the first source layer SL1. The second tunnel insulating layer TL2 may be disposed between the channel structure CS and the first source layer SL1, the second data storage layer DL2 may be interposed between the second tunnel insulating layer TL2 and the first source layer SL1, and the second blocking layer BKL2 may be interposed between the second data storage layer DL2 and the first source layer SL1.

The first tunnel insulating layer TL1 and the second tunnel insulating layer TL2 may be spaced apart from each other in the third direction D3. The second source layer SL2 may be provided between the first tunnel insulating layer TL1 and the second tunnel insulating layer TL2. The first data storage layer DL1 and the second data storage layer DL2 may be spaced apart from each other in the third direction. The second source layer SL2 may be provided between the first data storage layer DL1 and the second data storage layer DL2. The first blocking layer BKL1 and the second blocking layer BKL2 may be spaced apart from each other in the third direction D3. The second source layer SL2 may be provided between the first blocking layer BKL1 and the second blocking layer BKL2.

The first and second tunnel insulating layers TL1 and TL2 may include a material through which charges can tunnel. In an example, the first and second tunnel insulating layers TL1 and TL2 may include oxide including nitrogen.

The first and second data storage layers DL1 and DL2 may include a material in which charges can be trapped. In an example, the first and second data storage layers DL1 and DL2 may include nitride.

The first and second blocking layers BKL1 and BKL2 may include a material capable of blocking movement of charges. In an example, the first and second blocking layers BKL1 and BKL2 may include oxide.

In an example, a concentration of nitrogen of the first and second data storage layers DL1 and DL2 may be higher than that of nitrogen of the first and second blocking layers BKL1 and BKL2. In an example, the first and second blocking layers BKL1 and BKL2 might not include nitrogen. In an example, a concentration of nitrogen of the first and second tunnel insulating layers TL1 and TL2 may be higher than that of nitrogen of the first and second blocking layers BKL1 and BKL2. In an example, the concentration of nitrogen of the first and second tunnel insulating layers TL1 and TL2 may be lower than that of nitrogen of the first and second data storage layers DL1 and DL2.

The etch stop layer ES may be spaced apart from the channel structure CS. The second blocking layer BKL2 of the second memory layer ML2 and a second protrusion part P2 which will be described later may be disposed between the etch stop layer ES and the channel structure CS.

The second source layer SL2 of the source structure SCS may include first protrusion parts P1 and second protrusion parts P2.

The first protrusion part P1 may protrude toward the stack structure STS. The first protrusion part P1 may protrude in the third direction from the top surface SCS_T of the source structure SCS. The first protrusion part P1 may protrude in the third direction D3 from the top surface SL2_T of the second source layer SL2.

The first protrusion part P1 may have the shape of a ring surrounding the channel structure CS. The first protrusion part P1 may protrude between the first memory layer ML1 and the channel structure CS. The first protrusion part P1 may protrude between the first blocking layer BKL1 of the first memory layer ML1 and the channel structure CS.

The first protrusion part P1 may be in contact with a bottom surface TL1_B of the first tunnel insulating layer TL1, a sidewall DL1_S of the first data storage layer DL1, a bottom surface DL1_B of the first data storage layer DL1, and a sidewall BKL1_S of the first blocking layer BLK1. The first protrusion part P1 may be located at the same level as an insulating pattern IP at a lowermost portion of the stack structure STS. At least a portion of the first protrusion part P1 and at least a portion of the insulating pattern IP at the lowermost portion of the stack structure STS may be located at the same level.

The bottom surface TL1_B of the first tunnel insulating layer TL1, the bottom surface DL1_B of the first data storage layer DL1, and a bottom surface BKL1_B of the first blocking layer BKL1 may have different levels. The bottom surface DL1_B of the first data storage layer DL1 may be located at a level lower than that of the bottom surface TL1_B of the first tunnel insulating layer TL1. The bottom surface BKL1_B of the first blocking layer BKL1 may be located at a level lower than that of bottom surface DL1_B of the first data storage layer DL1. The top surface SCS_T of the source structure may be in contact with the bottom surface BKL1_B of the first blocking layer BKL1. The top surface SL2_T of the second source layer SL2 may be in contact with the bottom surface BKL1_B of the first blocking layer BKL1.

The first protrusion part P1 may have a stepped structure. A surface of the first protrusion part P1, which is in contact with the first tunnel insulating layer TL1, the first data storage layer DL1, and the first blocking layer BKL1, may have a step shape. The surface of the first protrusion part P1 may be formed in a step shape along the bottom surface BKL1_B of the first blocking layer BKL1, the sidewall DL1_S of the first data storage layer DL1, the bottom surface DL1_B of the first data storage layer DL1, and the sidewall BKL1_S of the first blocking layer BKL1.

The first protrusion part P1 may include a first part P1a and a second part P1b. The first part P1a may be in contact with the bottom surface TL1_B of the first tunnel insulating layer TL1 and the sidewall DL1_S of the first data storage layer DL1. The second part P1b may be in contact with the bottom surface DL1_B of the first data storage layer DL1 and the sidewall BKL1_S of the first blocking layer BKL1.

Each of the first part P1a and the second part P1b may have a constant width. In an example, the width of each of the first part P1a and the second part P1b in the first direction D1 may be constant. The first part P1a and the second part P1b may have different widths. The width of the second part P1b may be greater than that of the first part P1a. In an example, the width of the first part P1a in the first direction D1 may be defined as a fifth width W5, and the width of the second part P1b in the first direction D1 may be defined as a sixth width W6. The sixth width W6 may be greater than the fifth width W5. In an example, the fifth width W5 may be equal to the second width W2.

The first protrusion part P1 may be disposed between the top surface SL2_T of the second source layer SL2 and the bottom surface TL1_B of the first tunnel insulating layer TL1. The first protrusion part P1 may be disposed between the first blocking layer BKL1 and the channel structure CS.

The first part P1a of the first protrusion part P1 may be disposed between the bottom surface TL1_B of the first tunnel insulating layer TL1 and the bottom surface DL1_B of the first data storage layer DL1. The first part P1a of the first protrusion part P1 may be disposed between the channel layer CL and the sidewall DL1_S of the first data storage layer DL1. The second part P1b of the first protrusion part P1 may be disposed between the bottom surface DL1_B of the first data storage layer DL1 and the bottom surface BKL1_B of the first blocking layer BKL1. The second part P1b of the first protrusion part P1 may be disposed between the channel layer CL and the sidewall BKL1_S of the first blocking layer BKL1.

The first protrusion part P1 may be a portion of the second source layer SL2. The first protrusion part P1 may include a semiconductor material. In an example, the first protrusion part P1 may include doped poly-silicon.

The second protrusion part P2 may protrude in the opposite direction of the third direction D3 from a bottom surface SL2_B of the second source layer SL2. The second protrusion part P2 may protrude toward the first source layer SL1.

The second protrusion part P2 may have the shape of a ring surrounding the channel structure CS. The second protrusion part P2 may protrude between the second memory layer ML2 and the channel structure CS. The second protrusion part P2 may protrude between the second blocking layer BKL2 of the second memory layer ML2 and the channel structure CS.

The second protrusion part P2 may be in contact with a top surface TL2_T of the second tunnel insulating layer TL2, a sidewall DL2_S of the second data storage layer DL2, a top surface DL2_T of the second data storage layer DL2, and a sidewall BKL2_S of the second blocking layer BKL2. The second protrusion part P2 may be located at the same level as the etch stop layer ES. At least a portion of the second protrusion part P2 and at least a portion of the etch stop layer ES may be located at the same level.

The top surface TL2_T of the second tunnel insulating layer TL2, the top surface DL2_T of the second data storage layer DL2, and a top surface BKL2_T of the second blocking layer BKL2 may have different levels. The top surface DL2_T of the second data storage layer DL2 may be located at a level lower than that of the top surface BKL2_T of the second blocking layer BKL2. The top surface TL2_T of the second tunnel insulating layer TL2 may be located at a level lower than that of the top surface DL2_T of the second data storage layer DL2. The bottom surface SL2_B of the second source layer SL2 may be in contact with the top surface BKL2_T of the second blocking layer BKL2.

The second protrusion part P2 may have a stepped structure. A surface of the second protrusion part P2, which is in contact with the second tunnel insulating layer TL2, the second data storage layer DL2, and the second blocking layer BKL2, may have a step shape. The surface of the second protrusion part P2 may be formed in a step shape along the top surface TL2_T of the second tunnel insulating layer TL2, the sidewall DL2_S of the second data storage layer DL2, the top surface DL2_T of the second data storage layer DL2, and a sidewall BLK2_S of the second blocking layer BKL2.

The second protrusion part P2 may include a third part P2a and a fourth part P2b. The third part P2a may be in contact with the top surface TL2_T of the second tunnel insulating layer TL2 and the sidewall DL2_S of the second data storage layer DL2. The fourth part P2b may be in contact with the top surface DL2_T of the second data storage layer DL2 and the sidewall BKL2_S of the second blocking layer BKL2.

Each of the third part P2a and the fourth part P2b may have a constant width. In an example, the width of each of the third part P2a and the fourth part P2b in the first direction D1 may be constant. The third part P2a and the fourth part P2b may have different widths. The width of the fourth part P2b may be greater than that of the third part P2a. In an example, the width of the third part P2a in the first direction D1 may be defined as a seventh width W7, and the width of the fourth part P2b in the first direction D1 may be defined as an eighth width W8. The eighth width W8 may be greater than the seventh width W7. In an example, the seventh width W7 may be equal to the fourth width W4.

The second protrusion part P2 may be disposed between the bottom surface SL2_B of the second source layer SL2 and the top surface TL2_T of the second tunnel insulating layer TL2. The second protrusion part P2 may be disposed between the second blocking layer BKL2 and the channel structure CS.

The third part P2a of the second protrusion part P2 may be disposed between the top surface TL2_T of the second tunnel insulating layer TL2 and the top surface DL2_T of the second data storage layer DL2. The third part P2a of the second protrusion part P2 may be disposed between the channel layer CL and the sidewall DL2_S of the second data storage layer DL2. The fourth part P2b of the second protrusion part P2 may be disposed between the top surface DL2_T of the second data storage layer DL2 and the top surface BKL2_T of the second blocking layer BKL2. The fourth part P2b of the second protrusion part P2 may be disposed between the channel layer CL and the sidewall BKL2_S of the second blocking layer BKL2.

The second protrusion part P2 may be a portion of the second source layer SL2. The second protrusion part P2 may include a semiconductor material. In an example, the second protrusion part P2 may include doped poly-silicon.

A first insulating layer 120 may be provided on the stack structure STA. The first insulating layer 120 may cover the channel structures CS and the first memory layers ML1. The first insulating layer 120 may include an insulating material. In an example, the first insulating layer 120 may include oxide.

A slit structure SLS may be provided, which penetrates the stack structure STS and the first insulating layer 120. The slit structure SLS may extend in the second direction D2. The slit structure SLS may extend in the third direction D3. The slit structure SLS may penetrate the stack structure STS and the first insulating layer 120 in the third direction D3. The slit structure SLS may be disposed between the channel structures CS. Channel structures CS of a first group and channel structures CS of a second group may be spaced apart from each other in the first direction D1 with the slit structure SLS interposed therebetween.

The slit structure SLS may include first spacers SP1, second spacers SP2, and a common source line CSL. The second spacers SP2 may be disposed at both sides of the common source line CSL. The second spacers SP2 may be spaced apart from each other in the first direction D1. The common source line CSL may be provided between the second spacers SP2. The second spacers SP2 may be formed along both sidewalls of the common source line CSL.

The first spacers SP1 may be disposed at both the sides of the common source line CSL. The first spacers SP1 may be spaced apart from each other in the first direction D1. The second spacers SP2 and the common source line CSL may be provided between the first spacers SP1. The first spacer SP1 may be formed along a sidewall of the second spacer SP2.

The common source line CSL may be electrically connected to the source structure SCS. The common source line CSL may be electrically connected to the second source layer SL2. The common source line CSL may be integrally formed with the second source layer SL2. In other words, the common source line CSL may be coupled to the second source layer SL2 without any boundary. The common source line CSL and the conductive pattern CP may be electrically isolated from each other by the first spacer SP1 and the second spacer SP2.

Each of the first spacers SP1, the second spacers SP2, and the common source line CSL may extend in the second direction D2 and the third direction D3. The first spacer SP1 may have a curved bottom surface.

A portion of the blocking film BR may be formed between the insulating patterns IP of the stack structure STS and the first spacer SP1.

The first spacer SP1 may include a first part extending in the third direction D3 and second parts protruding from the first part. The second parts may protrude in the first direction D1 or the opposite direction of the first direction D1 from the first part. The second part may be in contact with the conductive pattern CP.

The first spacer SP1 may include an insulating material. In an example, the first spacer SP1 may include oxide. The second spacer SP2 may include an insulating material. In an example, the second spacer SP2 may include nitride. The common source line CSL may include a conductive material. In an example, the common source line CSL may include at least one of doped poly-silicon and tungsten.

Bit line contacts BCT may be provided, which are connected to the channel structures CS. The bit line contact BCT may be electrically connected to the channel layer CL of the channel structure CS. The bit line contacts BCT may penetrate the first insulating layer 120. The bit line contact BCT may include a conductive material. In an example, the bit line contact BCT may include tungsten, aluminum or copper. The bit line contacts BCT may be connected to a bit line.

The material which the etch stop layer includes may have an etch selectivity with respect to the material which each of the first source layer SL1, the second source layer SL2, the insulating pattern IP, and the first and second spacers SP1 and SP2 includes. The material which the etch stop layer ES includes may have an etch selectivity with respect to the material which each of the first and second tunnel insulating layers TL1 and TL2, the first and second data storage layers DL1 and DL2, the first and second blocking layers BKL1 and BKL2, and the channel layer CL includes. In an example, the material which the etch stop layer ES includes may have an etch selectivity with respect to oxide, nitride, and a semiconductor material.

In the semiconductor device in accordance with these embodiments, the first protrusion part P1 as a portion of the second source layer SL2 may be formed in a step shape. Thus, the contact area of the second source layer SL2 and the channel structure CS can increase. Further, the first protrusion part P1 is formed relatively close to a source select line, and thus a junction overlap region of the cannel layer CL can be relatively easily formed.

In an example, the junction overlap region is formed without any high heat treatment process, so that a characteristic change of the source select line due to the high heat treatment process can be prevented. Accordingly, a stable gate induced drain leakage (GIDL) current can be generated during an erase operation, and off-leakage of the source select line can be minimized. Thus, the reliability of the erase operation can be ensured. Further, a characteristic of the source select line is improved, so that a number of source select lines can be minimized.

FIG. 2A is a sectional view of a semiconductor device in accordance with an embodiment of the present disclosure. FIG. 2B is an enlarged view of region E shown in FIG. 2A.

The semiconductor device in accordance with these embodiments may be similar to the semiconductor memory device shown in FIGS. 1A to 1E, except portions described below.

Referring to FIGS. 2A and 2B, a first blocking layer BLK1 may include a first blocking part BKL1a and a second blocking part BKL1b. The first blocking part BKL1a may be a part surrounding a first data storage layer DL1. The second blocking part BKL1b may be a part spaced apart from the first data storage layer DL1.

The first blocking part BKL1a may have a constant width. The second blocking part BKL1b may have a constant width. The width of the second blocking part BKL1b may be smaller than that of the first blocking part BKL1a. In an example, the width of the first blocking part BKL1a in a first direction D1 may be defined as a first width W1, and the width of the second blocking part BKL1b in the first direction may be defined as a second width W2. The first width W1 may be greater than the second width W2.

An upper portion of the second blocking part BKL1b and a lower portion of the first blocking part BKL1a may be connected to each other. A level of a bottom surface of the second blocking part BKL1b may be equal to that of a bottom surface of an insulating pattern IP at a lowermost portion of a stack structure STS.

A second source layer SL2 may include a third protrusion part P3. The third protrusion part P3 may protrude in a third direction D3 from a top surface of a second source layer SL2. The third protrusion part P3 may be in contact with a bottom surface of a first tunnel insulating layer TL1, a bottom surface of the first data storage layer DL1, a bottom surface of the first blocking port BKL1a, and a sidewall of the second blocking part BKL1b.

The bottom surface of the first tunnel insulating layer TL1, the bottom surface of the first data storage layer DL1, and the bottom surface of the first blocking part BKL1a may be located at the same level. The third protrusion part P3 may be disposed between a channel layer CL and the sidewall of the second blocking part BKL1b. The second blocking part BKL1b may surround the third protrusion part P3. The first blocking part BKL1a may be located at a level higher than that of the third protrusion part P3. The second blocking part BKL1b may be located at the same level as the third protrusion part P3.

The second blocking layer BKL2 may include a third blocking part BKL2a and a fourth blocking part BKL2b. The third blocking part BKL2a may be a part surrounding a second data storage layer DL2. The fourth blocking part BKL2b may be a part spaced apart from the second data storage layer DL2.

The third blocking part BKL2a may have a constant width. The fourth blocking part BKL2b may have a constant width. The width of the fourth blocking part BKL2b may be smaller than that of the third blocking part BKL2a. In an example, the width of the third blocking part BKL2a in the first direction D1 may be defined as a third width W3, and the width of the fourth blocking part BKL2b in the first direction D1 may be defined as a fourth width W4. The third width W3 may be greater than the fourth width W4.

A lower portion of the fourth blocking part BKL2b and an upper portion of the third blocking part BKL2a may be connected to each other. A level of a top surface of the fourth blocking part BKL2b may be higher than that of a top surface of an etch stop layer ES.

The second source layer SL2 may include a fourth protrusion part P4. The fourth protrusion part P4 may protrude in the opposite direction of the third direction D3 from a bottom surface of the second source layer SL2. The fourth protrusion part P4 may be in contact with a top surface of a second tunnel insulating layer TL2, a top surface of the second data storage layer DL2, a top surface of the third blocking part BKL2a, and a sidewall of the fourth blocking part BKL2b.

The top surface of the second tunnel insulating layer TL2, the top surface of the second data storage layer DL2, and the top surface of the third blocking part BKL2a may be located at the same level. The fourth protrusion part P4 may be disposed between the channel layer CL and the sidewall of the fourth blocking part BKL2b. The fourth blocking part BKL2b may surround the fourth protrusion part P4. The third blocking part BKL2a may be located at a level lower than that of the fourth protrusion part P4. The fourth blocking part BKL2b may be located at the same level as the fourth protrusion part P4.

In the semiconductor device in accordance with these embodiments, the third protrusion part P3 is formed relatively close to a source select line, and thus a junction overlap region of the channel layer CL can be relatively easily formed.

In an example, the junction overlap region is formed without any high heat treatment process, so that a characteristic change of the source select line due to the high heat treatment process can be prevented. Accordingly, a GIDL current can be generated during an erase operation, and off-leakage of the source select line can be minimized. Thus, the reliability of the erase operation can be ensured. Further, a characteristic of the source select line is improved, so that a number of source select lines can be minimized.

FIGS. 3A to 3K are sectional views illustrating a manufacturing method of the semiconductor device shown in FIGS. 1A to 1E.

For convenience of description, components described with reference to FIGS. 1A to 1E are designated by like reference numerals, and overlapping descriptions will be omitted.

A manufacturing method described below is merely one embodiment of the manufacturing method of the semiconductor memory device shown in FIGS. 1A to 1E, and the manufacturing method of the semiconductor memory device shown in FIGS. 1A to 1E might not be limited to that described below.

Figure 3A:
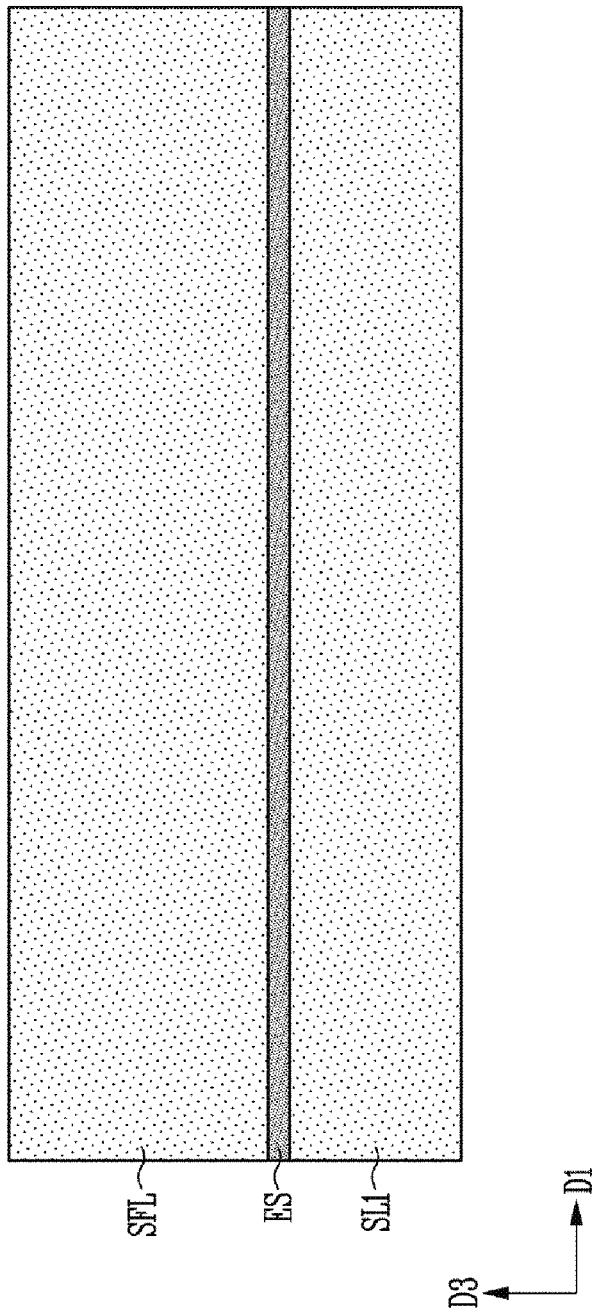

Referring to FIG. 3A, an etch stop layer ES and a source sacrificial layer SFL may be sequentially formed on a first source layer SL1. The first source layer SL1, the etch stop layer ES, and the source sacrificial layer SFL may be sequentially stacked in a third direction D3. The first source layer SL1 and the source sacrificial layer SFL may be spaced apart from each other in the third direction D3, and the etch stop layer ES may be disposed between the first source layer SL1 and the source sacrificial layer SFL.

The first source layer SL1 may include a semiconductor material. In an example, the first source layer SL1 may include poly-silicon. The etch stop layer ES may include an insulating material. In an example, the etch stop layer ES may include at least one of SiCO and SiCN. The source sacrificial layer SFL may include a semiconductor material. In an example, the source sacrificial layer SFL may include poly-silicon.

Figure 3B:
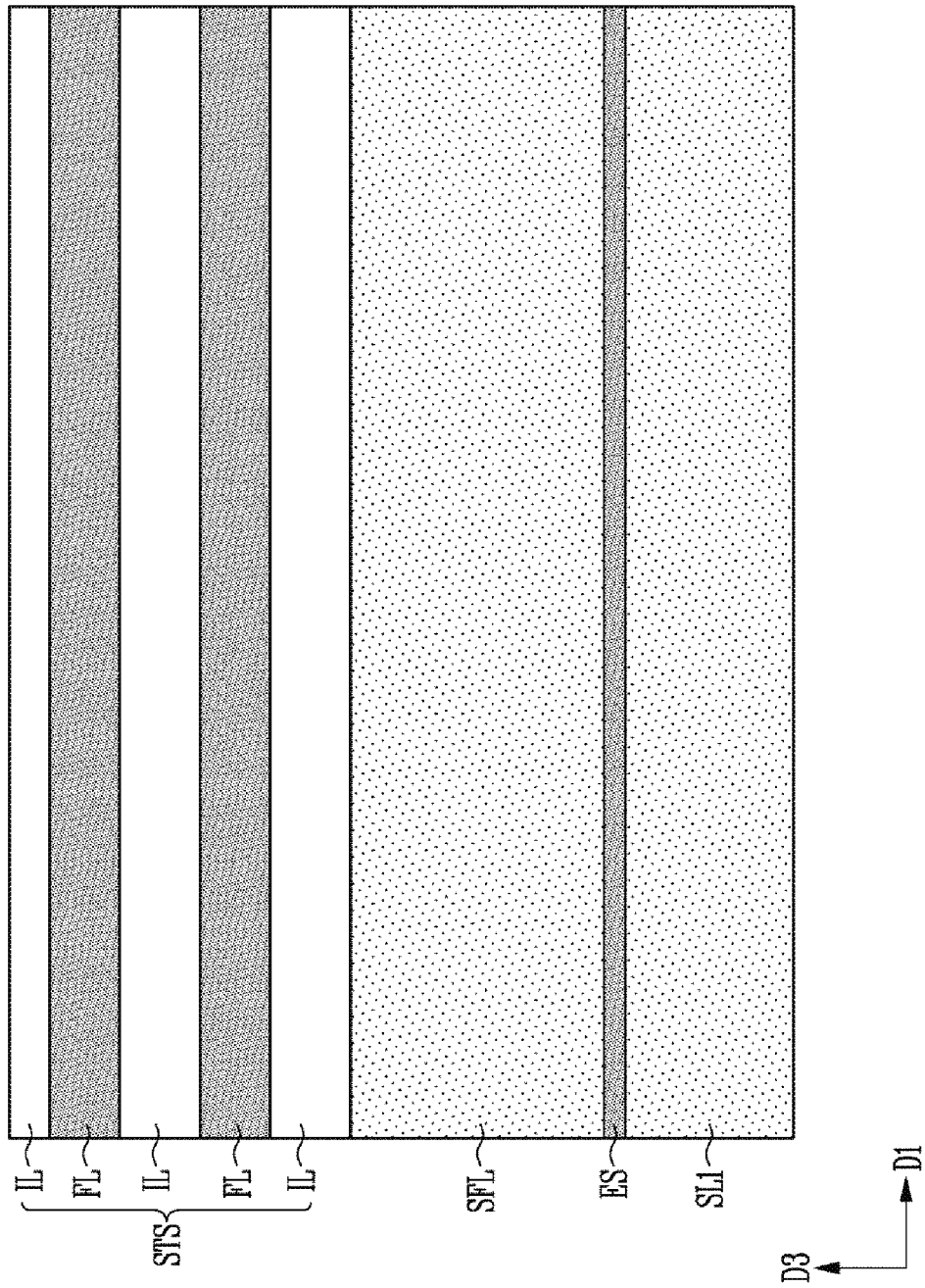

Referring to FIG. 3B, a stack structure STS may be formed on the source sacrificial layer SFL. The stack structure STS may include stacked insulating layers IL and stacked sacrificial layers FL. The stacked insulating layers IL and the stacked sacrificial layers FL may be alternately stacked in the third direction D3. A stacked insulating layer IL may be provided on the source sacrificial layer SFL, and stacked insulating layers IL and stacked sacrificial layers FL may be alternately stacked on the stacked insulating layer IL.

The stacked insulating layers IL and the stacked sacrificial layers FL may include an insulating material. In an example, the stacked insulating layers IL may include oxide. In an example, the stacked sacrificial layers FL may include nitride.

Although a case where the stacked sacrificial layer FL is replaced with a conductive pattern CP after the stacked insulating layer IL and the stacked sacrificial layer FL is described in these embodiments, the present disclosure is not limited thereto. In an example, a channel structure CS and a memory layer ML may be formed after the stacked insulating layer IL and a conductive layer are alternately formed.

Figure 3C:
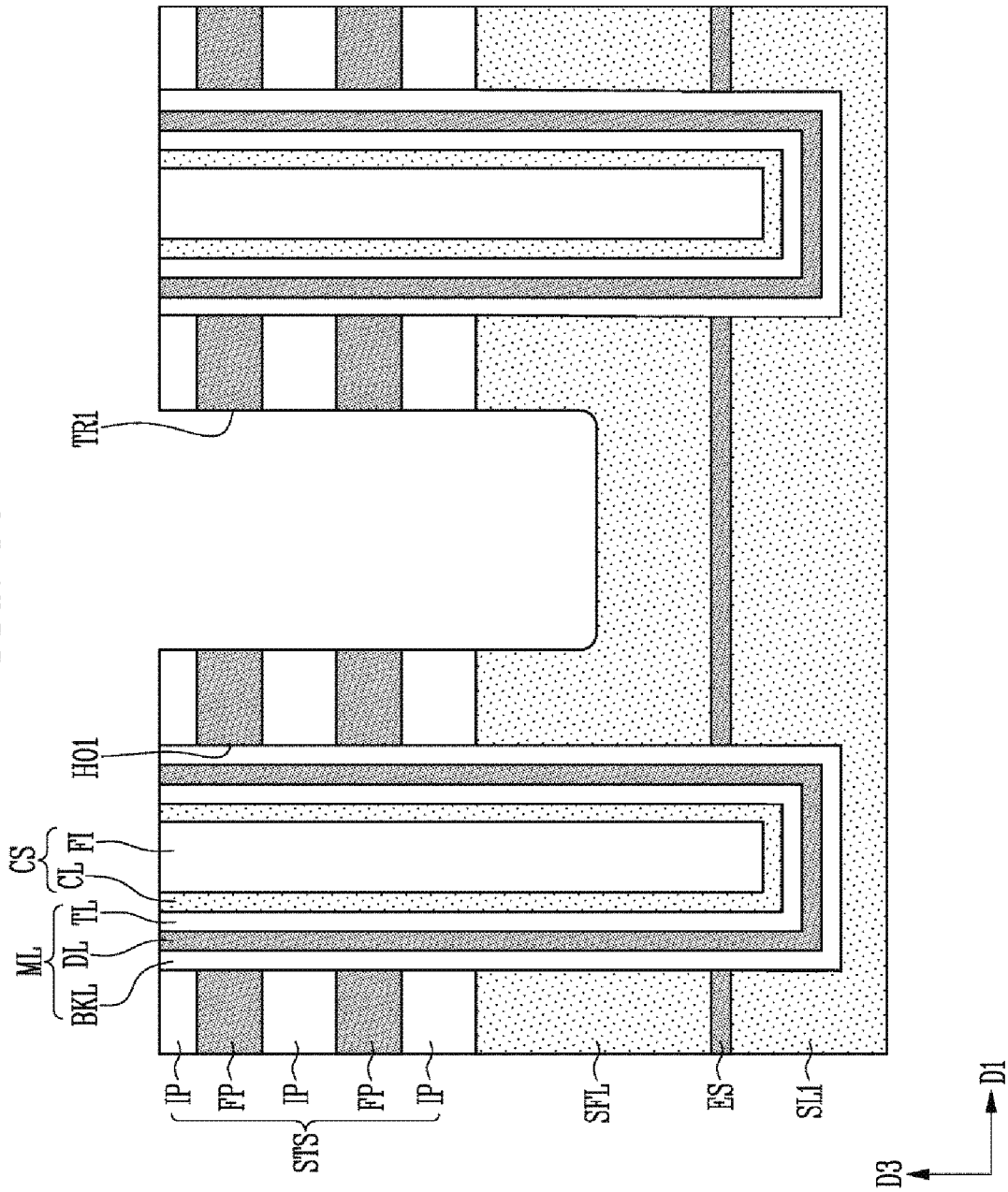

Referring to FIG. 3C, channel structures CS and memory layers ML may be formed, which penetrate the stack structure STS, the source sacrificial layer SFL, and the etch stop layer ES. The channel structures CS and the memory layers ML may penetrate the stacked insulating layers IL and the stacked sacrificial layers FL of the stack structure STS.

The channel structure CS may include a channel layer CL and a filling layer FI. The memory layer ML may include a tunnel insulating layer TL, a data storage layer DL, and a blocking layer BKL.

The process of forming the channel structures CS and the memory layers CL may include a process of forming first holes HO1 penetrating the stack structure STS, the source sacrificial layer SFL, and the etch stop layer ES, and a process of sequentially forming the blocking layer BKL, the data storage layer DL, the tunnel insulating layer TL, the channel layer CL, and the filling layer FI in the first hole HO1.

In an example, the tunnel insulating layer TL may include oxide including nitrogen. The data storage layer DL may include a material in which charges can be trapped. In an example, the data storage layer DL may include nitride. The blocking layer BKL may include a material capable of blocking movement of charges. In an example, the blocking layer BKL may include oxide. In an example, the blocking layer BKL might not include nitrogen.

In an example, a concentration of nitrogen of the tunnel insulating layer TL may be higher than that of nitrogen of the blocking layer BKL. In an example, the tunnel insulating layer TL may include nitrogen, and the blocking layer BKL might not include nitrogen.

A width of the blocking layer BKL may be greater than that of the tunnel insulating layer TL. In an example, the width of the blocking layer BKL in a first direction D1 may be greater than that of the tunnel insulating layer TL in the first direction D1.

A first trench TR1 may be formed, which penetrates the stack structure STS. The first trench TR1 may extend in a second direction D2. The first trench TR1 may penetrate the stacked insulating layers IL and the stacked sacrificial layers FL of the stack structure STS. A bottom surface of the first trench TR1 may be located in the source sacrificial layer SFL. The bottom surface of the first trench TR1 may be defined by the source sacrificial layer SFL. The bottom surface of the first trench TR1 may be located between a top surface and a bottom surface of the source sacrificial layer SFL.

According to the process of forming the first holes HO1 and the process of forming the first trench TR1, the stacked insulating layers IL and the stacked sacrificial layers FL may be patterned, so that insulating patterns IP and the sacrificial patterns FP are formed.

Figure 3D:
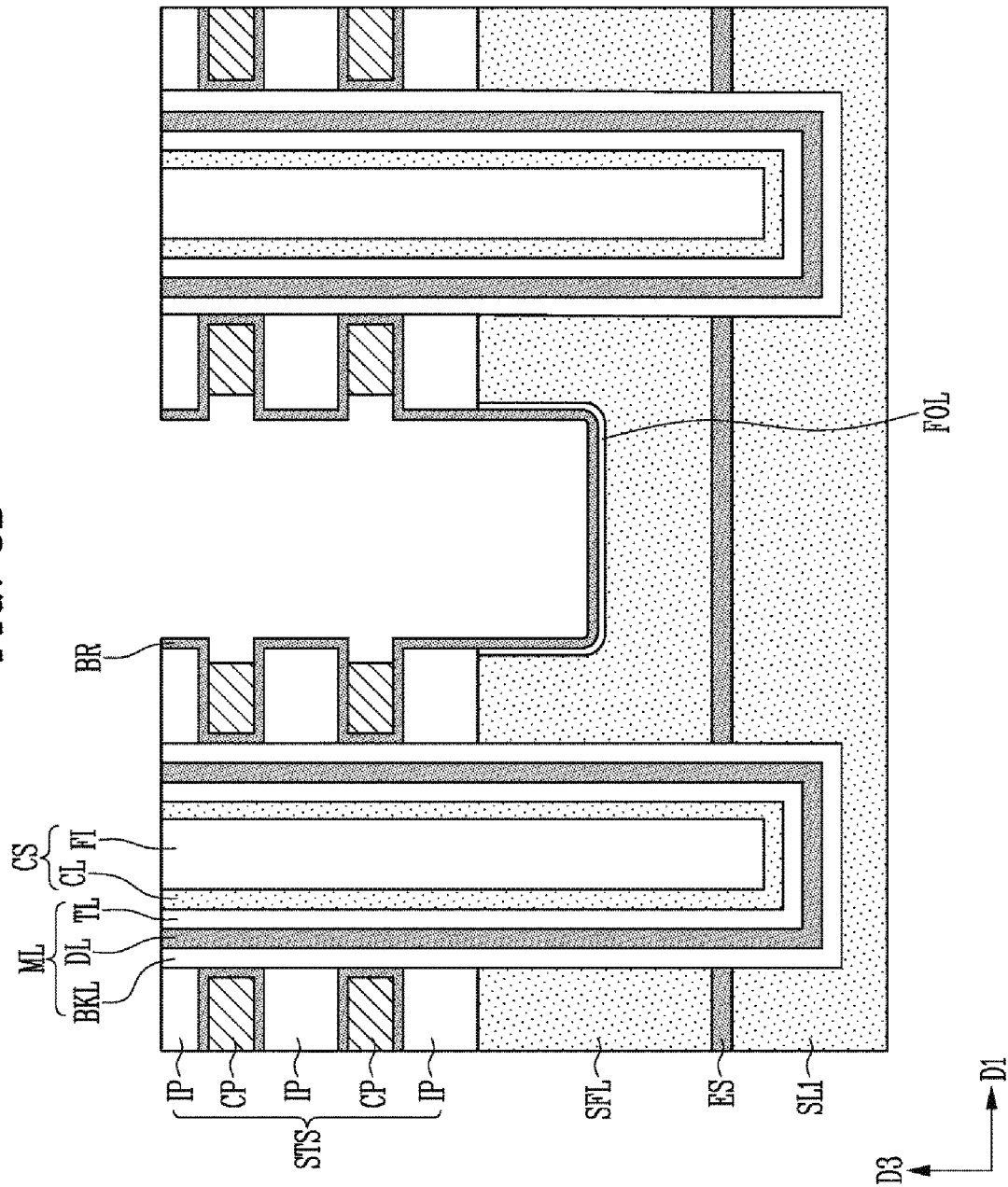

Referring to FIG. 3D, a sacrificial oxide layer FOL, conductive patterns CP, and a blocking film BR may be formed.

The sacrificial oxide layer FOL may be formed by oxidizing a portion of the source sacrificial layer SFL. A surface of the source sacrificial layer SFL, which is exposed by the first trench TR1, may be oxidized, so that the sacrificial oxide layer FOL is formed. In an example, the surface of the source sacrificial layer SFL may be oxidized by supplying an oxygen gas through the first trench TR1. The sacrificial oxide layer FOL may include an insulating material. In an example, the sacrificial oxide layer FOL may include oxide.

The process of forming the conductive patterns CP and the blocking film BR may include a process of forming empty spaces between the insulating patterns IP by selectively removing the sacrificial patterns FP, a process of forming the blocking film BR along surfaces of the insulating patterns IP, a surface of the channel structure CS, and a surface of the sacrificial oxide layer FOL, a process of filling the empty spaces by forming a conductive layer along a surface of the blocking film BR, and a process of forming the conductive patterns CP by patterning the conductive layer.

The conductive layer may completely fill the empty spaces, and fill a portion of the first trench TR1. Portions of the conductive layer formed in the empty spaces may be isolated from each other, so that the conductive patterns CP are formed.

Figure 3E:
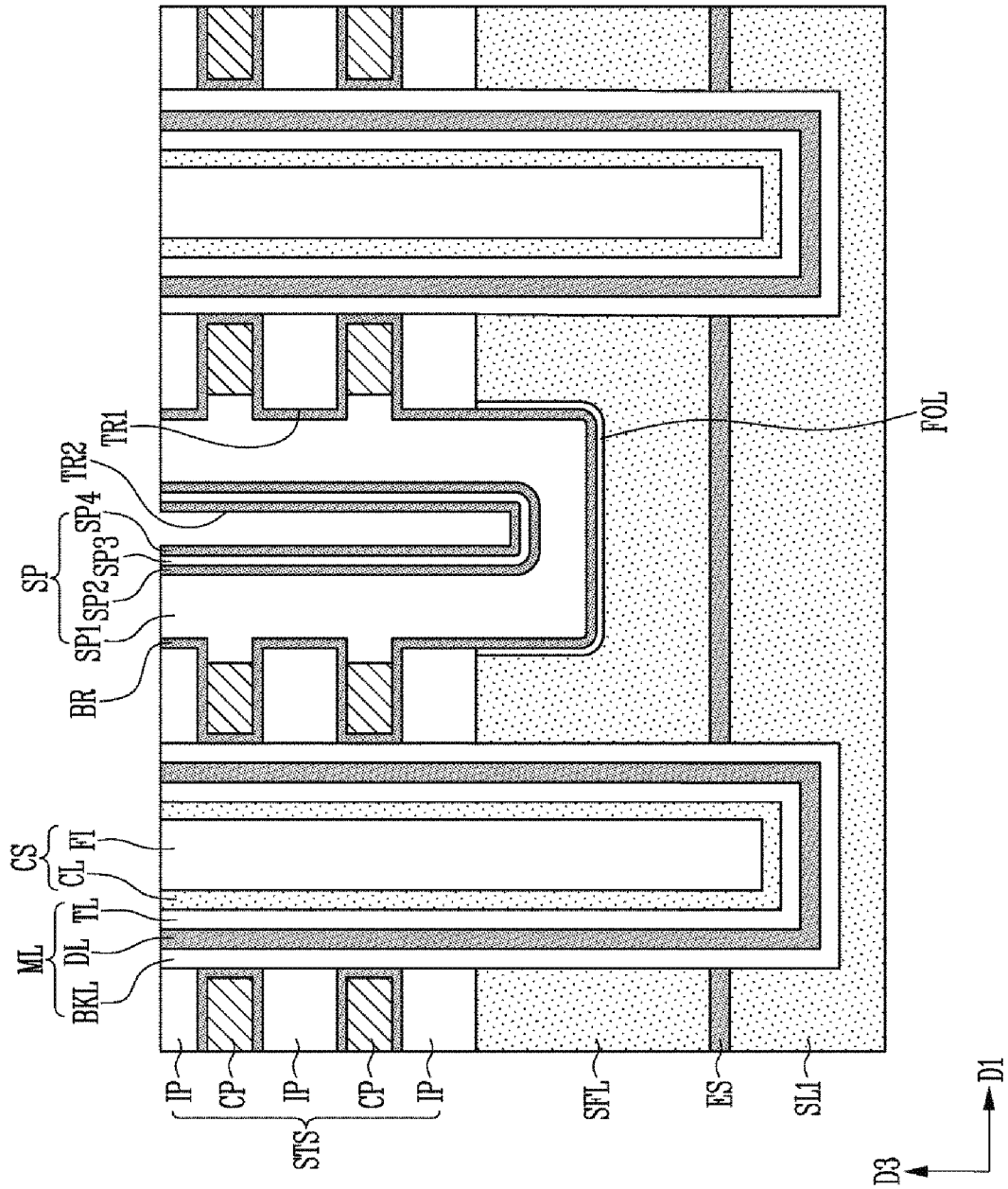

Referring to FIG. 3E, a spacer SP may be formed in the first trench TR1. The spacer SP may include an insulating material. In an example, the spacer SP may include first to fourth spacers SP1, SP2, SP3, and SP4. The process of forming the spacer SP may include a process of forming the first spacer SP1 on surfaces of the blocking film BR and the conductive patterns CP, a process of forming the second spacer SP2 on a surface of the first spacer SP1, a process of forming the third spacer SP3 on a surface of the second spacer SP2, and a process of forming the fourth spacer SP4 on a surface of the third spacer SP3.

The spacer SP may fill a portion of the first trench TR1. In other words, the spacer SP might not completely fill the first trench TR1. A portion of the first trench TR1, which is not filled by the spacer SP, may be defined as a second trench TR2. The second trench TR2 may extend in the second direction D2. A surface of the fourth spacer SP4 may be exposed by the second trench TR2. The second trench TR2 may be defined by the surface of the fourth spacer SP4.

The first to fourth spacers SP1, SP2, SP3, and SP4 may include an insulating material. In an example, the first and third spacers SP1 and SP3 may include oxide. In an example, the second and fourth spacers SP2 and SP4 may include nitride.

Referring to FIG. 3F, a third trench TR3 may be formed. The third trench TR3 may extend in the second trench D2. The third trench TR3 may penetrate the spacer SP and the sacrificial oxide layer FOL. The third trench TR3 may penetrate the first to fourth spacers SP1, SP2, SP3, and SP4. A bottom surface of the third trench TR3 may be located in the source sacrificial layer SFL. In an example, the third trench TR3 may be formed through an etch-back process. When the third trench TR3 is formed, the source sacrificial layer SFL may be exposed. The source sacrificial layer SFL may be exposed by the second trench TR2 and the third trench TR3.

Figure 3G:
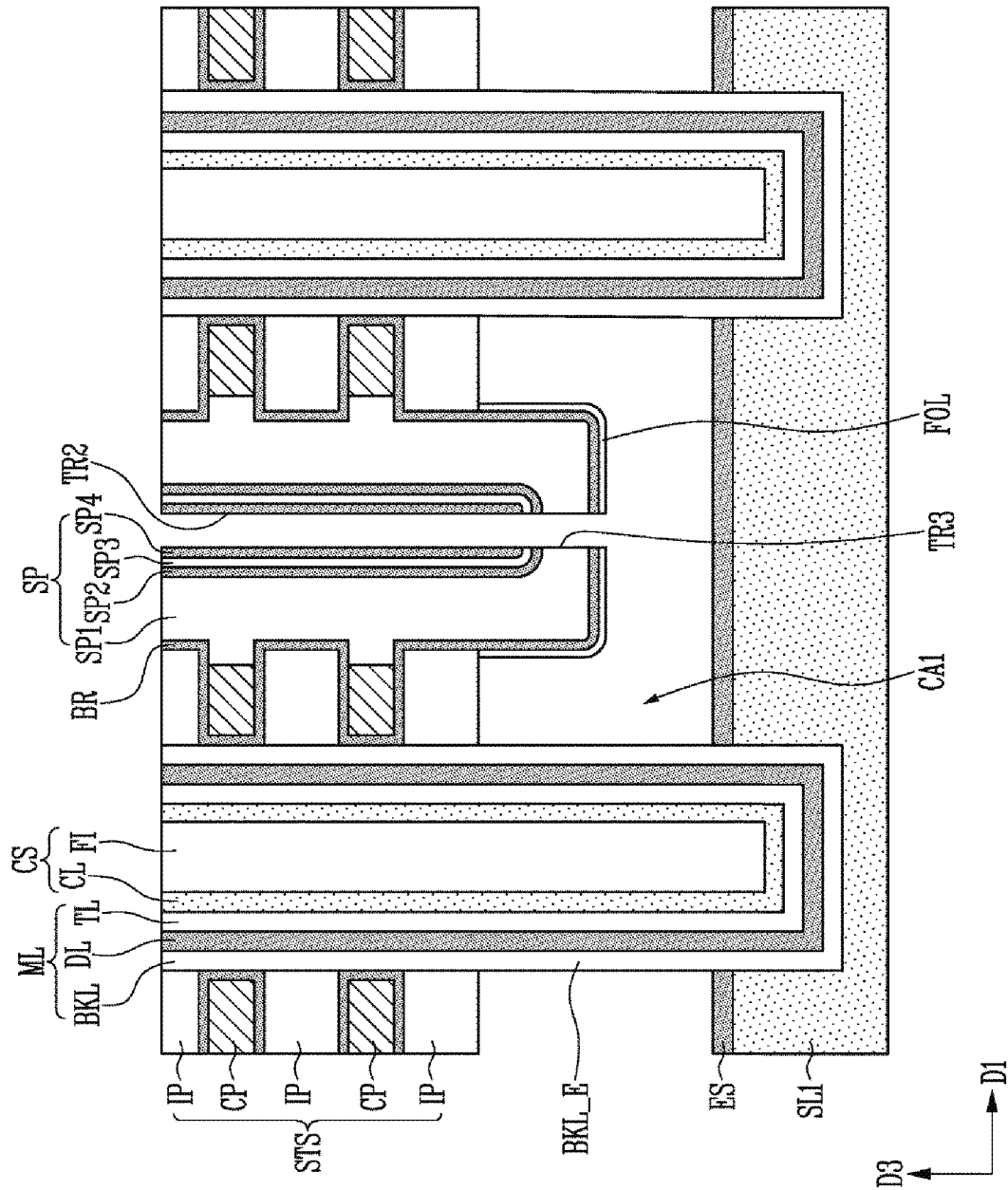

Referring to FIG. 3G, the source sacrificial layer SFL may be removed. The source sacrificial layer SFL may include a material different from that of the etch stop layer ES. The material which the source sacrificial layer SFL includes may have an etch selectivity with respect to the material which the etch stop layer ES includes. The source sacrificial layer SFL may include a material different from that of the spacer SP. The material which the source sacrificial layer SFL includes may have an etch selectivity with respect to the material which the spacer SP includes. The source sacrificial layer SFL may include a material different from that of the sacrificial oxide layer FOL. The material which the source sacrificial layer SFL includes may have an etch selectivity with respect to the material which the sacrificial oxide layer FOL incudes.

The source sacrificial layer SFL may be removed through an etching process. The source sacrificial layer SFL may be removed through a wet etching process or a dry etching process. The etching process may be performed using an etching material capable of selectively removing the source sacrificial layer SFL.

When the source sacrificial layer SFL is removed, a first cavity CA1 may be formed. An empty space formed by removing the source sacrificial layer SFL may be defined as the first cavity CA1. When the first cavity CA1 is formed, a top surface of the etch stop layer ES may be exposed, the blocking layer BKL of the memory layer ML may be exposed, and a bottom surface of an insulating pattern IP at a lowermost portion of the stack structure STS may be exposed.

A portion of the blocking layer BKL, which is exposed by the first cavity CA1, may be defined as a first exposure region BKL_E. When the source sacrificial layer SFL is removed, the first exposure region BKL_E of the blocking layer BKL may be exposed. The first exposure region BKL_E of the blocking layer BKL may be disposed between the stack structure STS and the etch stop layer ES.

Figure 3H:
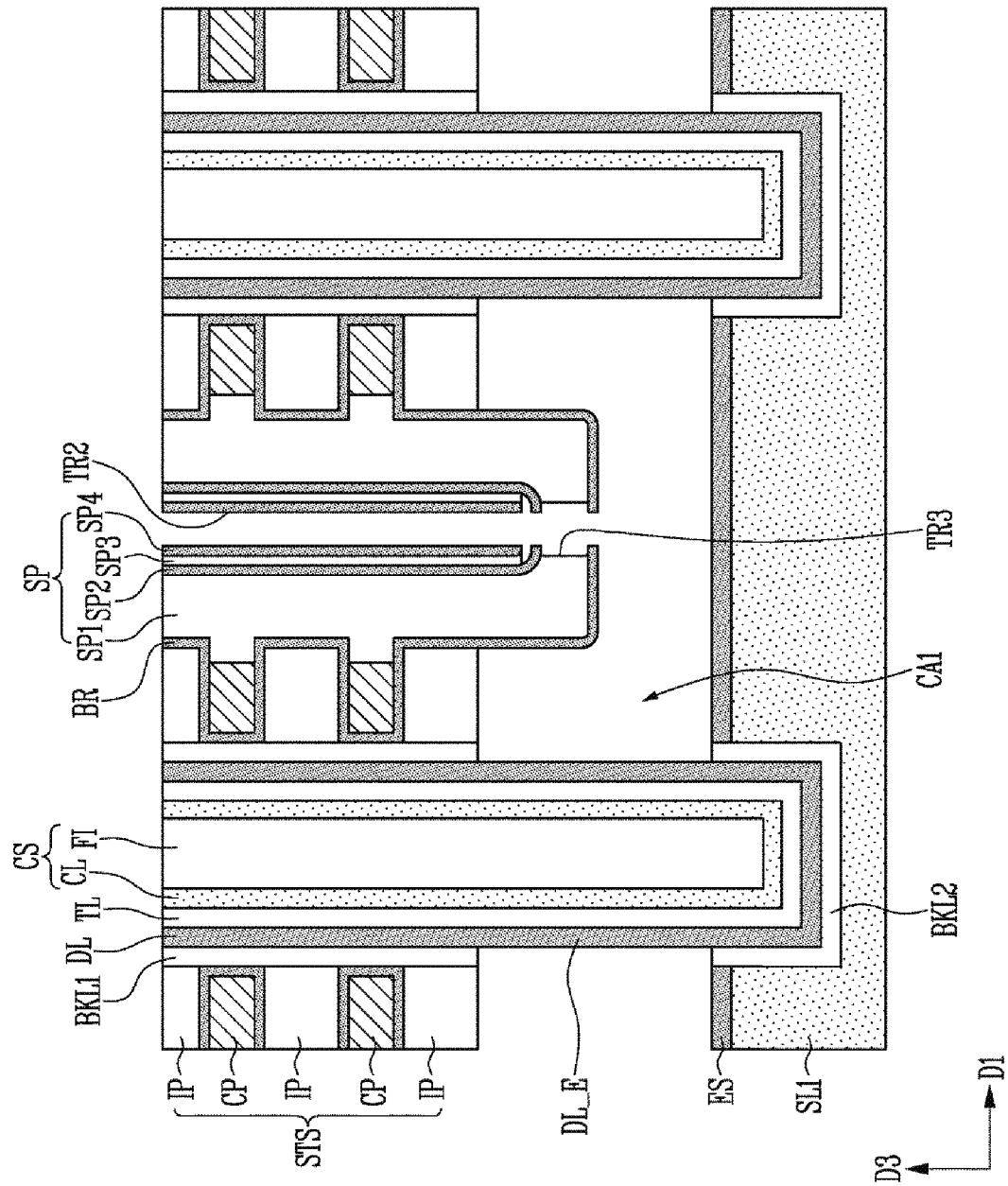

Referring to FIG. 3H, the first exposure region BKL_E of the blocking layer BKL may be removed. The first exposure region BKL_E of the blocking layer BKL may be removed through an etching process. The process of removing the first exposure region BKL_E of the blocking layer BKL may be performed using a first etching material. In an example, the first exposure region BKL_E of the blocking layer BKL may be removed through a dry etching process. In an example, the dry etching process may be a dry cleaning process.

When the first exposure region BKL_E of the blocking layer BKL is removed, the blocking layer BKL may be separated into a first blocking layer BKL1 and a second blocking layer BKL2. The first blocking layer BLK1 and the second blocking layer BKL2 may be spaced apart from each other in the third direction DR3.

While the first exposure region BKL_E of the blocking layer BKL is being removed, the etch stop layer ES may prevent the first source layer SL1 from being exposed. While the first exposure region BKL_E of the blocking layer BKL is being removed, the etch stop layer ES may protect the first source layer SL1 from the first etching material.

The sacrificial oxide layer FOL may be removed at the same time when the first exposure region BKL_E of the blocking layer BKL is removed or through a separate process.

Portions of the first spacer SP1 and the third spacer SP3 may be removed at the same time when the first exposure region BKL_E of the blocking layer BKL is removed or through a separate process. A portion of the first spacer SP1, which is exposed by the third trench TR3, may be removed, and a portion of the third spacer SP3, which is exposed by the third trench TR3, may be removed.

The material which the fourth spacer SP4 includes may have an etch selectivity with respect to the material which the blocking layer BKL includes. The first to third spacers SP1, SP2, and SP3 may be protected by the fourth spacer SP4.

The first cavity CA1 may be expanded when the first exposure region BKL_E of the blocking layer BKL is removed, and the data storage layer DL may be exposed by the first cavity CA1.

A portion of the data storage layer DL, which is exposed by the first cavity CA1, may be defined as a second exposure region DL_E. When the first exposure region BKL_E of the blocking layer BKL is removed, the second exposure region DL_E of the data storage layer DL may be exposed. The second exposure region DL_E of the data storage layer DL may be disposed between the stack structure STS and the etch stop layer ES.

Figure 3I:
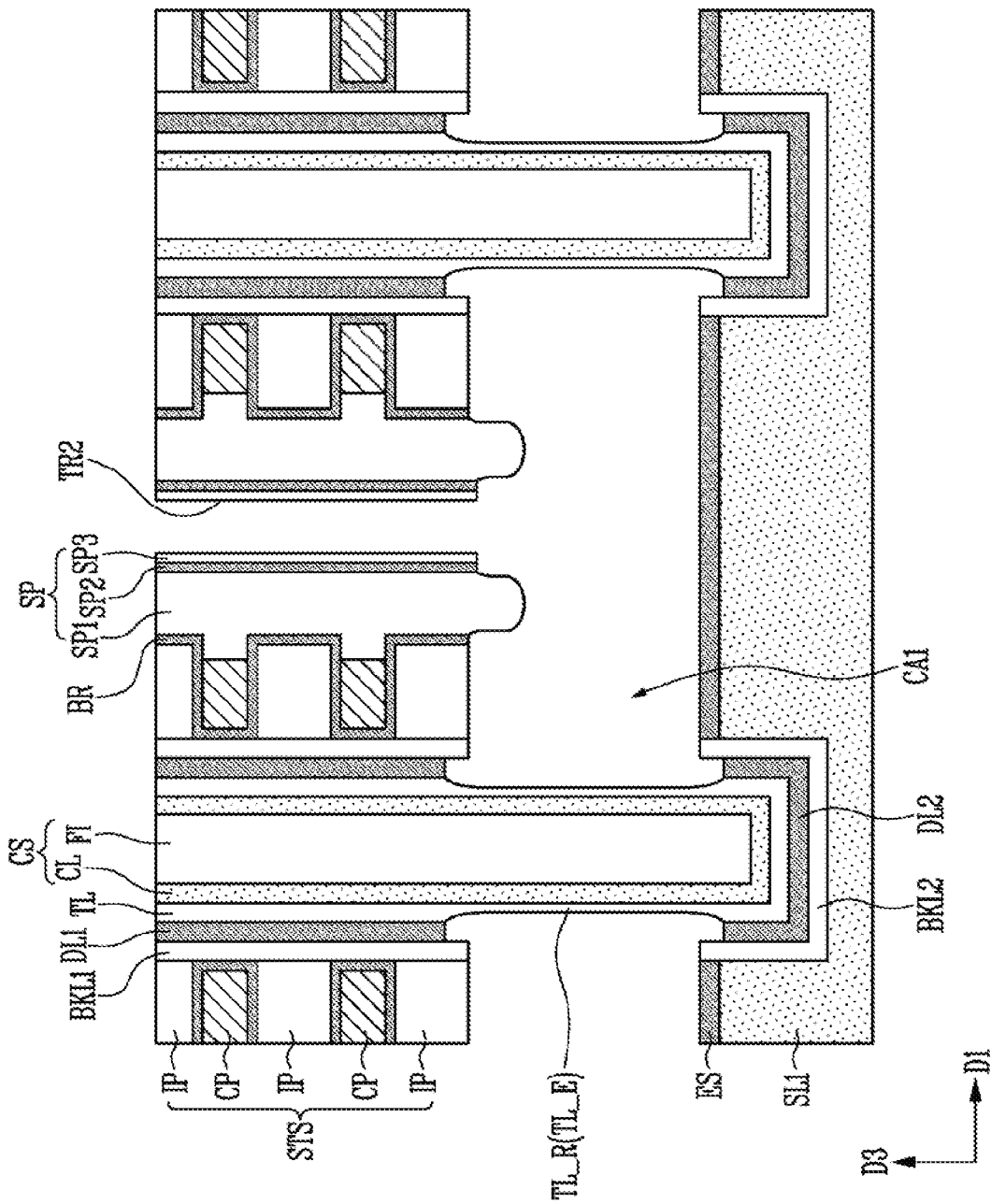

Referring to FIG. 3I, the second exposure region DL_E of the data storage layer DL may be removed. The second exposure region DL_E of the data storage layer DL may be removed through an etching process. The process of removing the second exposure region DL_E of the data storage layer DL may be performed using a second etching material.

In an example, the second etching material may be a material capable of etching nitride. In an example, the second etching material may include phosphoric acid and water. In an example, the second etching material may further include another material together with phosphoric acid and water.

A speed at which the second etching material etches nitride may be faster than that at which the second etching material etches oxide. In an example, the speed at which the second etching material etches nitride may be five times to twenty times faster than that at which the second etching material etches oxide.

In an example, the second exposure region DL_E of the data storage layer DL may be removed through a wet etching process. In an example, the wet etching process may be a dip-out process.

When the second exposure region DL_E of the data storage layer DL is removed, the data storage layer DL may be separated into a first data storage layer DL1 and a second data storage layer DL2. The first data storage layer DL1 and the second data storage layer DL2 may be spaced apart from each other in the third direction D3.

When the second exposure region DL_E of the data storage layer DL is removed, portions of the data storage layer DL, which are adjacent to the second exposure region DL_E, may be removed together. Accordingly, a bottom surface of the first data storage layer DL1 may be located at a level higher than that of a bottom surface of the first blocking layer BKL1, and a top surface of the second data storage layer DL2 may be located at a level lower than that of a top surface of the second blocking layer BLK2.

When the second exposure region DL_E of the data storage layer DL is removed, the first cavity CA1 may be expanded, and the tunnel insulating layer TL may be exposed by the first cavity CA1.

A portion of the tunnel insulating layer TL, which is exposed by the first cavity CA1, may be defined as a third exposure region TL_E. When the second exposure region DL_E of the data storage layer DL_E is removed, the third exposure region TL_E of the tunnel insulating layer TL may be exposed. The third exposure region TL_E of the tunnel insulating layer TL may be disposed between the bottom surface of the first data storage layer DL1 and the top surface of the second data storage layer DL2.

When the second exposure region DL_E of the data storage layer DL_E is removed, a portion of the third exposure region TL_E of the tunnel insulating layer TL may be removed together with the second exposure region DL_E of the data storage layer DL_E. A portion of the third exposure region TL_E of the tunnel insulating layer TL may be removed by the second etching material which removes the data storage layer DL.

In an example, a speed at which the tunnel insulating layer TL is etched by the second etching material may be slower than that at which the data storage layer DL is etched by the second etching material. Therefore, when the second exposure region DL_E of the data storage layer DL_E is removed, a portion of the third exposure region TL_E of the tunnel insulating layer TL may remain.

In an example, since a concentration of nitrogen of the tunnel insulating layer TL is lower than that of nitrogen of the data storage layer DL, a portion of the third exposure region TL_E of the tunnel insulating layer TL may remain, when the second exposure region DL_E of the data storage layer DL is removed.

The portion of the third exposure region TL_E of the tunnel insulating layer TL, which is not removed but remains, may be defined as a remaining portion TL_R. The remaining portion TL_R of the tunnel insulating layer TL may be located between the first cavity CA1 and the channel structure CS.

While the second exposure region DL_E of the data storage layer DL and the portion of the third exposure region TL_E of the tunnel insulating layer TL are being removed, the first and second blocking layers BKL1 and BLK2 might not be etched.

In an example, since a concentration of nitrogen of the first and second blocking layers BKL1 and BKL2 is lower than that of nitrogen of the tunnel insulating layer TL, the first and second blocking layers BKL1 and BKL2 might not be etched, or an etching amount of the first and second blocking layers BKL1 and BKL2 may be smaller than that of the tunnel insulating layer TL.

While the second exposure region DL_E of the data storage layer DL and the portion of the third exposure region TL_E of the tunnel insulating layer TL are being removed, the etch stop layer ES may prevent the first source layer SL from being exposed. While the second exposure region DL_E of the data storage layer DL and the portion of the third exposure region TL_E of the tunnel insulating layer TL are being removed, the etch stop layer ES may protect the first source layer SL1 from the second etching material.

The fourth spacer SP4 may be removed at the same time when the second exposure region DL_E of the data storage layer DL and the portion of the third exposure region TL_E of the tunnel insulating layer TL are removed or through a separate process. When the fourth spacer SP4 is removed, a sidewall of the third spacer SP3 may be exposed.

A portion of the second spacer SP2 may be removed at the same time when the second exposure region DL_E of the data storage layer DL and the portion of the third exposure region TL_E of the tunnel insulating layer TL are removed or through a separate process. A portion of the second spacer SP2, which is exposed through the third trench TR3, may be removed.

The first and second spacers SP1 and SP2 may be protected by the third spacer SP3 while the data storage layer DL is being etched.

Figure 3J:
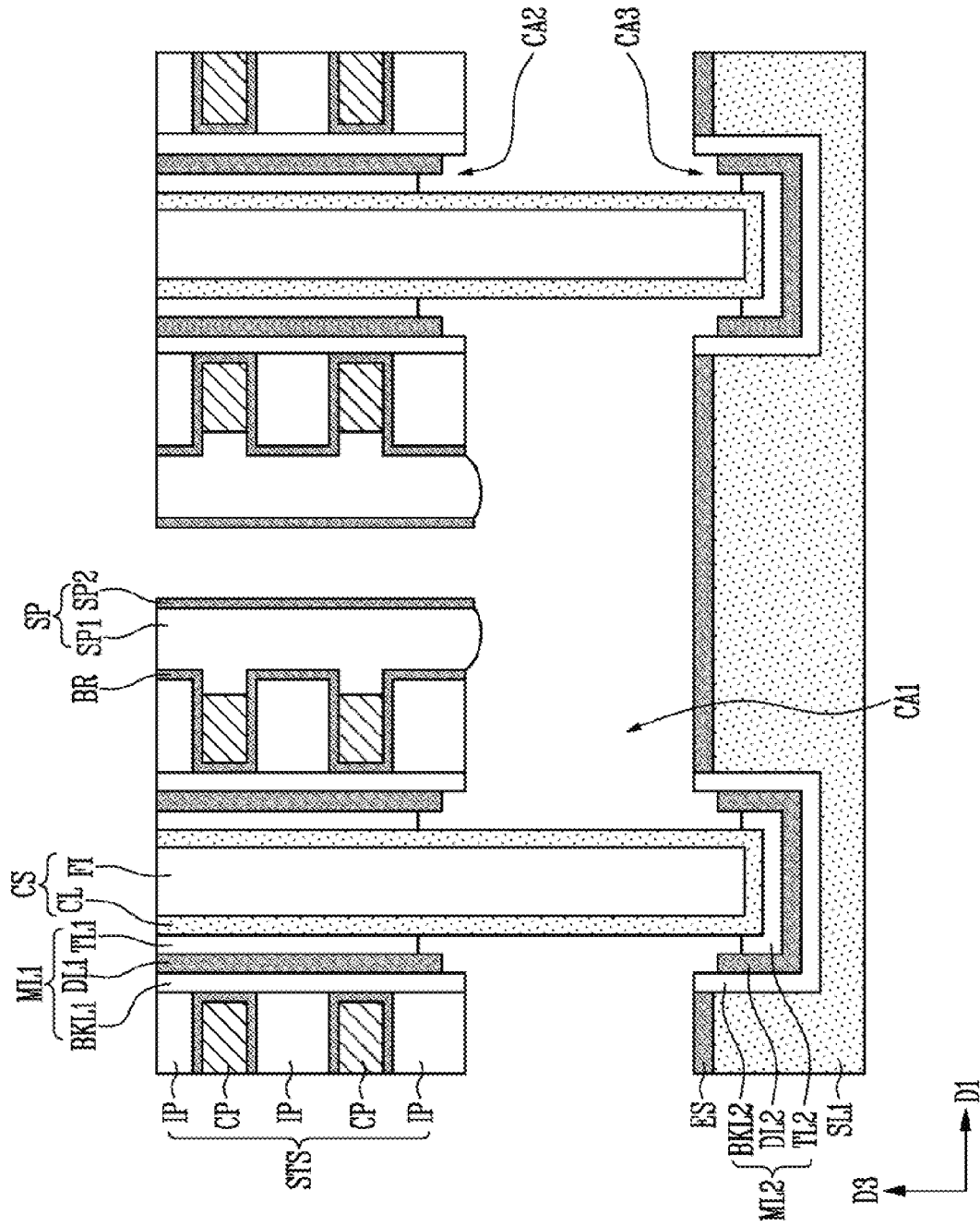

Referring to FIG. 3J, the remaining portion TL_R of the tunnel insulating layer TL may be removed. The remaining portion TL_R of the tunnel insulating layer TL may be removed through an etching process. The process of removing the remaining portion TL_R of the tunnel insulating layer TL may be performed using a third etching material. In an example, the third etching material may be a material capable of etching oxide including nitrogen. In an example, the remaining portion TL_R of the tunnel insulating layer TL may be etched through a dry etching process. In an example, the dry etching process may be a dry cleaning process.

When the remaining portion TL_R of the tunnel insulating layer TL is etched, the tunnel insulating layer TL may be separated into a first tunnel insulating layer TL1 and a second tunnel insulating layer TL2. The first tunnel insulating layer TL1 and the second tunnel insulating layer TL2 may be spaced apart from each other in the third direction D3.

When the remaining portion TL_R of the tunnel insulating layer TL is removed, portions of the tunnel insulating layer TL, which are adjacent to the remaining portion TL_R of the tunnel insulating layer TL, may be removed together with the remaining portion TL_R of the tunnel insulating layer TL. Accordingly, a bottom surface of the first tunnel insulating layer TL1 may be located at a level higher than that of the bottom surface of the first data storage layer DL1, and a top surface of the second tunnel insulating layer TL2 may be located at a level lower than that of the top surface of the second data storage layer DL2.

When the remaining portion TL_R of the tunnel insulating layer TL is removed, the first cavity CA1 may be expanded. The channel structure CS may be exposed by the first cavity CA1.

The remaining portion TL_R of the tunnel insulating layer TL may be selectively etched with respect to the first and second blocking layers BKL1 and BKL2. In other words, when the remaining portion TL_R of the tunnel insulating layer TL is etched, the first and second blocking layer BKL1 and BKL2 might not be etched, or an etching amount of the first and second blocking layers BKL1 and BKL2 may be smaller than that of the remaining portion TL_R of the tunnel insulating layer TL. When the remaining portion TL_R of the tunnel insulating layer TL is removed, the first and second blocking layers BKL1 and BKL2 might not be lost.

The remaining portion TL_R of the tunnel insulating layer TL may be selectively etched under a condition in which the tunnel insulating layer TL has a high etch selectivity with respect to the first and second blocking layers BKL1 and BKL2. In an example, the condition in which the tunnel insulating layer TL has a high etch selectivity with respect to the first and second blocking layers BKL1 and BKL2 may correspond to a difference in concentration of nitrogen between the first and second blocking layers BKL1 and BKL2.

In an example, the remaining portion TL_R of the tunnel insulating layer TL may be selectively etched by allowing the material which the tunnel insulating layer TL includes and the material which the first and second blocking layers BKL1 and BKL2 include to be different from each other, and using a material capable of selectively etching the tunnel insulating layer TL.

In an example, since a concentration of nitrogen of the first and second blocking layers BKL1 and BKL2 is lower than that of nitrogen of the tunnel insulating layer TL, the first and second blocking layers BKL1 and BKL2 might not be etched, or an etching amount of the first and second blocking layers BKL1 and BKL2 may be smaller than that of the tunnel insulating layer TL.

While the remaining portion TL_R of the tunnel insulating layer TL is being removed, the etch stop layer ES may prevent the first source layer SL from being exposed. While the remaining portion TL_R of the tunnel insulating layer TL is being removed, the etch stop layer ES may protect the first source layer SL1 from the third etching material.

When the first tunnel insulating layer TL1 and the second tunnel insulating layer TL2 are formed since the remaining portion TL_R of the tunnel insulating layer TL is removed, a first memory layer ML1 including the first tunnel insulating layer TL1, the first data storage layer DL1, and the first blocking layer BKL1 may be formed, and a second memory layer ML2 including the second tunnel insulating layer TL2, the second data storage layer DL2, and the second blocking layer BKL2 may be formed. The first memory layer ML1 and the second memory layer ML2 may be spaced apart from each other in the third direction D3.

A space formed between the first blocking layer BKL1 and the channel structure may be defined by a second cavity CA2. A space formed between the second blocking layer BKL2 and the channel structure CS may be defined as a third cavity CA3. The second cavity CA2 may be defined by the channel layer CL, the bottom surface of the first tunnel insulating layer TL1, the bottom surface and a sidewall of the first data storage layer DL1, and a sidewall of the first blocking layer BKL1. The third cavity CA3 may be defined by the channel layer CL, the top surface of the second tunnel insulating layer TL2, the top surface and a sidewall of the second data storage layer DL2, and a sidewall of the second blocking layer BKL2.

The third spacer SP3 may be removed at the same time when the remaining portion TL_R of the tunnel insulating layer TL is removed or through a separate process. When the third spacer SP3 is removed, a sidewall of the second spacer SP2 may be exposed.

The first spacer SP1 may be protected by the second spacer SP2 while the tunnel insulating layer TL is being etched.

A portion of the first spacer SP1 may be removed at the same time when the remaining portion TL_R of the tunnel insulating layer TL is removed or through a separate process. When a portion of the first spacer SP1 is removed, the first spacer SP1 may have a curved bottom surface.

Referring to FIG. 3K, a second source layer SL2 may be formed between the first source layer SL1 and the stack structure STS. The second source layer SL2 may be electrically connected to the channel layer CL of the channel structure CS. The second source layer SL2 may include a first protrusion part P1 in the second cavity CA2 and a second protrusion part P2 in the third cavity CA3. The second source layer SL2 may include a semiconductor material. In an example, the second source layer SL2 may include doped poly-silicon.

A dopant in the second source layer SL2 may be diffused into the channel layer CL. In an example, the dopant may be diffused into the channel layer CL through a heat treatment process. The dopant in the second source layer SL2 may be diffused into the channel layer CL through the first protrusion part P1 of the second source layer SL2, and form a junction overlap region.

In the manufacturing method of the semiconductor device in accordance with these embodiments, a portion of the third exposure region TL_E of the tunnel insulating layer TL is removed at the same time when the second exposure region DL_E of the data storage layer DL is removed. Subsequently, the remaining portion TL_R of the tunnel insulating layer TL is removed. Accordingly, the first tunnel insulating layer TL1 and the first data storage layer DL1 can define a stepped surface, and the first protrusion part P1 having a stepped structure can be formed.

A common source line CSL connected to the second source layer SL2 may be formed. The common source line CSL may be formed at the same time when the second source layer SL2 is formed or after the second source layer SL2 is formed. The common source line CSL may be formed between the first spacers SP1. The common source line CSL may be formed between the second spacers SP2. The common source line CSL may be integrally formed with the second source line SL2. In other words, the common source line CSL may be coupled to the second source layer SL2 without any boundary. The common source line CSL may include a conductive material. In an example, the common source line CSL may include at least one of doped poly-silicon and tungsten.

FIGS. 4A to 4C are sectional views illustrating a manufacturing method of the semiconductor device shown in FIGS. 2A and 2B.

The manufacturing method in accordance with these embodiments may be similar to the manufacturing method shown in FIGS. 3A to 3K, except portions described below.

A manufacturing method described below is merely an embodiment of the manufacturing method of the semiconductor memory device shown in FIGS. 2A and 2B, and the manufacturing method of the semiconductor memory device shown in FIGS. 2A and 2B might not be limited to that described below.

Referring to FIG. 4A, similarly to the manufacturing method described with reference to FIGS. 3A to 3H, a first source layer SL1, an etch stop layer ES, a stack structure, a channel structure CS, and a spacer SP may be formed. The stack structure STS may include conductive patterns CP, insulating patterns IP, and a blocking film BR. The spacer may include first to third spacers SP1, SP2, and SP3.

A blocking layer may be etched, so that first and second blocking layers BKL1 and BKL2 are formed. A data storage layer may be etched, so that first and second data storage layers DL1 and DL2 are formed. When the data storage layer is etched, a portion of a tunnel insulating layer TL may be removed together with the data storage layer, and a remaining portion TL_R of the tunnel insulating layer TL may be formed. In an example, since a concentration of nitrogen of the tunnel insulating layer TL is lower than that of nitrogen of the data storage layer, the remaining portion TL_R of the tunnel insulating layer TL may remain.

Referring to FIG. 4B, the remaining portion TL_R of the tunnel insulating layer TL may be removed. The remaining portion TL_R of the tunnel insulating layer TL may be removed through an etching process. When the remaining portion TL_R of the tunnel insulating layer TL is removed, the tunnel insulating layer TL may be separated into a first tunnel insulating layer TL1 and a second tunnel insulating layer TL2.

The first tunnel insulating layer TL1 may be etched such that a level of a bottom surface of the first tunnel insulating layer TL1 is equal to that of a bottom surface of the first data storage layer DL1, and the second tunnel insulating layer TL2 may be etched such that a level of a top surface of the second tunnel insulating layer TL2 is equal to that of a top surface of the second data storage layer DL2.

When the remaining portion TL_R of the tunnel insulating layer TL is removed, portions of the first and second blocking layers BKL1 and BKL2 may be removed together with the remaining portion TL_R of the tunnel insulating layer TL. The remaining portion TL_R of the tunnel insulating layer TL may be etched such that an etching speed of the tunnel insulating layer TL is faster than that of the first and second blocking layers BKL1 and BKL2.

In an example, since a concentration of nitrogen of the first and second blocking layers BKL1 and BKL2 is lower than that of nitrogen of the tunnel insulating layer TL, and a thickness of the first and second blocking layers BKL1 and BKL2 is thicker than that of the tunnel insulating layer TL, a second blocking part BKL1b of the first blocking layer BKL1 and a fourth blocking part BKL2b of the second blocking layer BKL2 may remain.

A portion of the first blocking layer BKL1 may be removed, so that first and second blocking parts BKL1a and BKL1b are defined. A bottom surface of the first blocking part BKL1a may be formed at the same level as a bottom surface of the first tunnel insulating layer TL1 and the bottom surface of the first data storage layer DL1. A fourth cavity CA4 may be defined by a sidewall of the second blocking part BKL1b, the first blocking part BKL1a, the bottom surface of the first tunnel insulating layer TL1, and the bottom surface of the first data storage layer DL1.

A portion of the second blocking layer BKL2 may be removed, so that third and fourth blocking parts BKL2a and BKL2b are defined. A top surface of the third blocking part BKL2a may be formed at the same level as the top surface of the second tunnel insulating layer TL2 and the top surface of the second data storage layer DL2. A fifth cavity CA5 may be defined by a sidewall of the fourth blocking part BKL2b, the top surface of the third blocking part BKL2a, the top surface of the second tunnel insulating layer TL2, and the top surface of the second data storage layer DL2.

An upper portion of the etch stop layer ES may be removed at the same time when the remaining portion TL_R of the tunnel insulating layer TL is removed or through a separate process. Since an upper portion of the etch stop layer ES is removed, a level of a top surface of the etch stop layer ES may be lower than that of the top surface of the second blocking layer BKL2.

Referring to FIG. 4C, a second source layer SL2 may be formed between the first source layer SL1 and the stack structure STS. The second source layer SL2 may include a third protrusion part P3 in the fourth cavity CA4 and a fourth protrusion part P4 in the fifth cavity CA5. Subsequently, a common source line CSL connected to the second source layer SL2 may be formed.

In the manufacturing method of the semiconductor device in accordance with these embodiments, the first to fourth blocking parts BKL1a, BKL1b, BKL2a, and BKL2b are formed by removing portions of the first and second blocking layers BKL1 and BKL2 together with the remaining portion TL_R of the tunnel insulating layer TL, when the remaining portion TL_R of the tunnel insulating layer TL is removed. Accordingly, the fourth and fifth cavities CA4 and CA5 can be formed, and the third and fourth protrusion parts P3 and P4 can be formed.

FIG. 5 is a block diagram illustrating a configuration of a memory system in accordance with an embodiment of the present disclosure.

Referring to FIG. 5, the memory system 1100 in accordance with the embodiment of the present disclosure includes a memory device 1120 and a memory controller 1110.

The memory device 1120 may include the structure described with reference to FIGS. 1A to 1E or the structure described with reference to FIGS. 2A and 2B. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

FIG. 6 is a block diagram illustrating a configuration of a computing system in accordance with an embodiment of the present disclosure.

Referring to FIG. 6, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1200 may be configured with a memory device 1212 and a memory controller 1211 as described with reference to FIG. 5.

In the semiconductor device in accordance with the present disclosure, a junction overlap region of a channel layer can be relatively easily formed. Accordingly, a stable GIDL current is generated during an erase operation, so that the reliability of the erase operation can be ensured.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
a stack structure including conductive patterns and insulating patterns which are alternately stacked;
a source structure including a first protrusion part;
a channel structure penetrating the stack structure, the channel structure being connected to the source structure;
a first tunnel insulating layer interposed between the channel structure and the stack structure;
a first data storage layer interposed between the first tunnel insulating layer and the stack structure; and
a first blocking layer interposed between the first data storage layer and the stack structure,
wherein the first protrusion part protrudes toward the first tunnel insulating layer and the first data storage layer between a sidewall of the first blocking layer and a sidewall of the channel structure, and is in contact with a bottom surface of the first tunnel insulating layer, a bottom surface of the first data storage layer, and the sidewall of the first blocking layer.

2. The semiconductor device of claim 1, wherein a surface of the first protrusion part, which is in contact with the first tunnel insulating layer, the first data storage layer, and the first blocking layer, has a step shape.

3. The semiconductor device of claim 1, wherein the bottom surface of the first tunnel insulating layer, the bottom surface of the first data storage layer, and a bottom surface of the first blocking layer are located at different levels.

4. The semiconductor device of claim 3, wherein the bottom surface of the first blocking layer is located at a level lower than a level of the bottom surface of the first tunnel insulating layer and a level of the bottom surface of the first data storage layer.

5. The semiconductor device of claim 4, wherein the bottom surface of the first data storage layer is located at a level lower than that of the bottom surface of the first tunnel insulating layer.

6. The semiconductor device of claim 1, wherein the bottom surface of the first data storage layer is located at substantially the same level as the bottom surface of the first tunnel insulating layer.

7. The semiconductor device of claim 1, wherein the first blocking layer includes a first blocking part surrounding the first data storage layer and a second blocking part surrounding the first protrusion part,
wherein a width of the second blocking part is smaller than that of the first blocking part.

8. The semiconductor device of claim 1, wherein a top surface of the source structure is in contact with a bottom surface of the first blocking layer.

9. The semiconductor device of claim 1, wherein the first protrusion part includes a first part in contact with the bottom surface of the first tunnel insulating layer and located between the first data storage layer and the channel structure, and a second part in contact with the bottom surface of the first data storage layer and a bottom surface of the first part and located between the first blocking layer and the channel structure.

10. The semiconductor device of claim 9, wherein the second part has a greater width than the first part.

11. The semiconductor device of claim 9, wherein a width of the first part is substantially the same as a width of the first tunnel insulating layer.

12. The semiconductor device of claim 9, wherein a width of the first tunnel insulating layer is less than a width of the first blocking layer.

13. A semiconductor device comprising:
a source structure;
a stack structure including conductive patterns and insulating patterns which are alternately stacked;
a channel structure penetrating the stack structure, the channel structure being connected to the source structure; and
a first memory layer interposed between the channel structure and the stack structure,
wherein the source structure includes a first protrusion part protruding between the first memory layer and the channel structure, and having a length in a direction in which the channel structure extends, and wherein the first protrusion part has a stepped structure and the length of the first protrusion part increases as the first protrusion part becomes closer to the channel structure.

14. The semiconductor device of claim 13,
further comprising a second memory layer interposed between the channel structure and a first source layer included in the source structure,
wherein the source structure includes:
an etch stop layer on the first source layer; and
a second source layer on the etch stop layer.

15. The semiconductor device of claim 14, wherein the second source layer includes a second protrusion part protruding between the second memory layer and the channel structure,
wherein the second protrusion part has a stepped structure.

16. The semiconductor device of claim 13, wherein the first protrusion part protrudes from a top surface of the source structure,
wherein the top surface of the source structure is in contact with a bottom surface of the insulating pattern at the lowermost portion of the stack structure.

17. The semiconductor device of claim 13, wherein the first memory layer includes a first tunnel insulating layer surrounding the channel structure and a first data storage layer surrounding the first tunnel insulating layer,
wherein the first tunnel insulating layer includes oxide including nitrogen, and
the first data storage layer includes a nitride.

18. The semiconductor device of claim 17, wherein the first memory layer further includes a first blocking layer surrounding the first data storage layer,
wherein a concentration of nitrogen of the first tunnel insulating layer is higher than that of nitrogen of the first blocking layer.

19. The semiconductor device of claim 13, wherein the first memory layer includes a first tunnel insulating layer, a first data storage layer surrounding the first tunnel insulating layer, and a first blocking layer surrounding the first data storage layer, wherein a bottom surface of the first tunnel insulating layer, a bottom surface of the first data storage layer, and a bottom surface of the first blocking layer are located at different levels.

20. A semiconductor device comprising:

a stack structure including conductive patterns and insulating patterns which are alternately stacked;

a source structure including a first protrusion part protruding toward the stack structure;

a channel structure penetrating the stack structure, the channel structure being connected to the source structure;

a first tunnel insulating layer interposed between the channel structure and the stack structure;

a first data storage layer interposed between the first tunnel insulating layer and the stack structure; and a first blocking layer interposed between the first data storage layer and the stack structure, wherein the first protrusion part extends to be interposed between the first blocking layer and the channel structure, wherein the first protrusion part extends to be interposed between the first data storage layer and the channel structure, and wherein an end of the first blocking layer is extended further in a direction adjacent to the source structure than an end of the first data storage layer.

\* \* \* \* \*